(12) United States Patent
Ok et al.

(10) Patent No.: US 10,661,273 B2
(45) Date of Patent: May 26, 2020

(54) TWO-DIMENSIONAL MICRO- AND NANO-PATTERN, METHODS FOR FORMING THE SAME, AND MICROFLUIDIC DEVICES FORMED THEREFROM

(71) Applicant: The Regents of the University of Michigan, Ann Arbor, MI (US)

(72) Inventors: Jong G. Ok, Seoul (KR); Lingjie J. Guo, Ann Arbor, MI (US); Long Chen, Ann Arbor, MI (US); Ashwin Panday, Ann Arbor, MI (US)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 513 days.

(21) Appl. No.: 15/293,134

(22) Filed: Oct. 13, 2016

(65) Prior Publication Data
US 2017/0100716 A1    Apr. 13, 2017

Related U.S. Application Data

(60) Provisional application No. 62/240,975, filed on Oct. 13, 2015.

(51) Int. Cl.
*B01L 3/00* (2006.01)
*B81C 1/00* (2006.01)

(52) U.S. Cl.
CPC ... *B01L 3/502707* (2013.01); *B01L 3/502761* (2013.01); *B81C 1/00031* (2013.01);
(Continued)

(58) Field of Classification Search
CPC ......... B01L 2200/12; B01L 2300/0893; B01L 2300/16; B01L 3/502707;
(Continued)

(56) References Cited

U.S. PATENT DOCUMENTS 8,547,504 B2   10/2013  Guo et al.
8,752,608 B2    6/2014  Ahn et al.
(Continued)

FOREIGN PATENT DOCUMENTS

JP        2004209971 A        7/2004

OTHER PUBLICATIONS

Jong G. Ok. et al. Continuous and High-throughput Nanopatterning Methodologies based on Mechanical Deformation. Journal of Materials Chemistry C (2013) 1, 7681.
(Continued)

*Primary Examiner* — Hina F Ayub
*Assistant Examiner* — Amanda Merlino
(74) *Attorney, Agent, or Firm* — Harness, Dickey & Pierce, P.L.C.

(57) ABSTRACT

Methods of forming two-dimensional nanopatterns are provided. The method may comprise periodically contacting a vibrating tool comprising a patterned grating edge with a substrate along a first direction in a grating-vibrational indentation patterning process. The patterned grating edge defines a plurality of rows and a plurality of interspersed troughs. The periodic contacting creates a two dimensional array of discontinuous voids in a single-stroke across the surface of the substrate. In other aspects, a microfluidic device for selective arrangement of a microspecies or nanospecies is provided, that includes a substrate comprising a surface defining a two-dimensional pattern of microvoids or nanovoids. In yet other aspects, the present disclosure provides a method for selective arrangement of a microspecies or nanospecies on a substrate.

19 Claims, 10 Drawing Sheets

(52) U.S. Cl.
CPC ..... *B81C 1/0046* (2013.01); *B01L 2200/0668* (2013.01); *B01L 2200/12* (2013.01); *B01L 2300/0877* (2013.01); *B01L 2300/0893* (2013.01); *B01L 2300/16* (2013.01); *B01L 2400/0487* (2013.01); *B81B 2201/058* (2013.01); *B81B 2203/033* (2013.01)

(58) Field of Classification Search
CPC ..... B01L 2200/0668; B01L 2300/0877; B01L 2400/0487; B01L 3/502761; B81B 2201/058; B81B 2203/033; B81C 1/00031; B81C 1/0046
See application file for complete search history.

(56) References Cited

U.S. PATENT DOCUMENTS

| | | |
|---|---|---|
| 8,848,140 B2 | 9/2014 | Guo et al. |
| 9,261,753 B2 | 2/2016 | Guo et al. |
| 2006/0065529 A1* | 3/2006 | Schlenoff ......... G01N 27/44752 204/450 |
| 2006/0160066 A1* | 7/2006 | Bhatia ................. B01J 19/0046 435/4 |

OTHER PUBLICATIONS

Ahn, S. H. et al., "Dynamic nanoinscribing for continuous and seamless metal and ploymer nanogratings," Nano Lett. 9, 4392-4397 (2009).

Ahn, S. H. et al. "Spontaneous Formation of Periodic Nanostructures by Localized Dynamic Wrinkling," Nano Lett. 9, 4392-4397 (2009).

Ok, J. G. et al, "Continuous fabrication of scalable 2-dimensional (2D) micro- and nanostructures by sequential 1D mechanical patterning process," Nanoscal 5, 4636-42 (2014).

Ahn, S. H. et al., "Large-Area Roll-to-Roll and Roll-to-Plate Nanoimprint Lithography: A Step toward High-Throughput Application of Continuous Nanoimprinting," ACSNANO 3, No. 8, 2304-2310 (2009).

Ashwin Panday, et al. Size Selective Nanoparticle Confinement in 2D Nanovoid Array in Aqueous Solution. 18th International Conference on Miniaturized Systems for Chemistry and Life Sciences. Oct. 26-30, 2014, San Antonio, Texas. pp. 1865-1867.

* cited by examiner a b

TWO-DIMENSIONAL MICRO- AND NANO-PATTERN, METHODS FOR FORMING THE SAME, AND MICROFLUIDIC DEVICES FORMED THEREFROM

CROSS-REFERENCE TO RELATED APPLICATIONS

This application claims the benefit of U.S. Provisional Application No. 62/240,975, filed on Oct. 13, 2015. The entire disclosure of the above application is incorporated herein by reference.

GOVERNMENT SUPPORT

This invention was made with government support under DMR-1120187 awarded by the National Science Foundation. The Government has certain rights in the invention.

FIELD

The present disclosure relates to methods for fabricating continuous and scalable multidimensional (e.g., two-dimensional (2D)) micro/nano-scale structures via a "single-stroke" 2D patterning using a grating tool with a vibrational indentation patterning (VIP) (Grating-VIP; G-VIP) and microfluidic devices incorporating such 2D micro/nano-scale structures for selective arrangement of nanospecies.

BACKGROUND

This section provides background information related to the present disclosure which is not necessarily prior art. Two-dimensional micro-patterning is more useful for manufacturing thin film structures and a variety of devices compared to vertically stacked one-dimensional array or three-dimensional composite structures. This planar two-dimensional nanopatterning has been used widely for various functional films such as anti-reflective coating, plasmonic surface, filters, bio-engineering template, etc. and applied to a variety of thin film devices, such as light source, organic optoelectronic devices, photovoltaic cells, etc, for improved performance. The two-dimensional micro-pattern is typically formed by using technologies such as laser interference lithography that involves reactive ion etching and electron beam lithography. However, these technologies have limit on the size of the pattern that can be formed, have low productivity and are expensive.

SUMMARY

This section provides a general summary of the disclosure, and is not a comprehensive disclosure of its full scope or all of its features.

In certain aspects, the present disclosure provides a method of forming a two-dimensional pattern on a substrate. The method may comprise periodically contacting a vibrating tool comprising a patterned grating edge with a substrate along a first direction in a grating-vibrational indentation patterning process. The patterned grating edge defines a plurality of rows and a plurality of interspersed troughs. The periodic contacting creates a two dimensional array of discontinuous voids in a single-stroke across the surface of the substrate.

In other aspects, the present disclosure provides a microfluidic device for selective arrangement of a microspecies and nanospecies. The microfluidic device comprises a substrate comprising a surface defining a two-dimensional pattern of microvoids or nanovoids. The microfluidic device includes a microfluidic compartment. The substrate is disposed within the microfluidic compartment and the surface contacts a fluid comprising the microspecies and nanospecies contained in the microfluidic compartment. The microfluidic device also includes an inlet and an outlet to the microfluidic compartment; where the fluid comprising the microspecies and nanospecies is introduced to the microfluidic compartment via the inlet and exits the microfluidic compartment via the outlet.

In yet other aspects, the present disclosure provides a method for selective arrangement of a microspecies and nanospecies on a substrate. The method comprises passing a fluid comprising a microspecies and nanospecies over a surface of the substrate comprising a two-dimensional pattern of microvoids or nanovoids. The fluid may be an ionic fluid. The microspecies and nanospecies have a first charge and the surface has a second charge opposite to the first charge. At least a portion of the microspecies and nanospecies in the fluid is trapped and assembled within the two-dimensional pattern of microvoids or nanovoids.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 1 shows a two-dimensional nanopattern formed with a dynamic nanoinscribing (DNI) technique in accordance with certain aspects of the present disclosure.

FIGS. 2A-2B. FIG. 2A shows a two-dimensional nanopattern formed with a vibrational indentation patterning (VIP) technique in accordance with certain other aspects of the present disclosure. FIG. 2B is a schematic depicting the overall VIP process where the vertically vibrating tool edge periodically or intermittently indents the line patterns on a linearly moving substrate.

FIG. 4A shows a dynamic nanoinscribing (DNI)-DNI grating, FIG. 4B shows a vibrational indentation patterning (VIP)-VIP grating, FIG. 4C shows a DNI-VIP grating, and FIG. 4D shows a VIP-DNI grating.

Figures 5A, 5B, 5C, 5D:
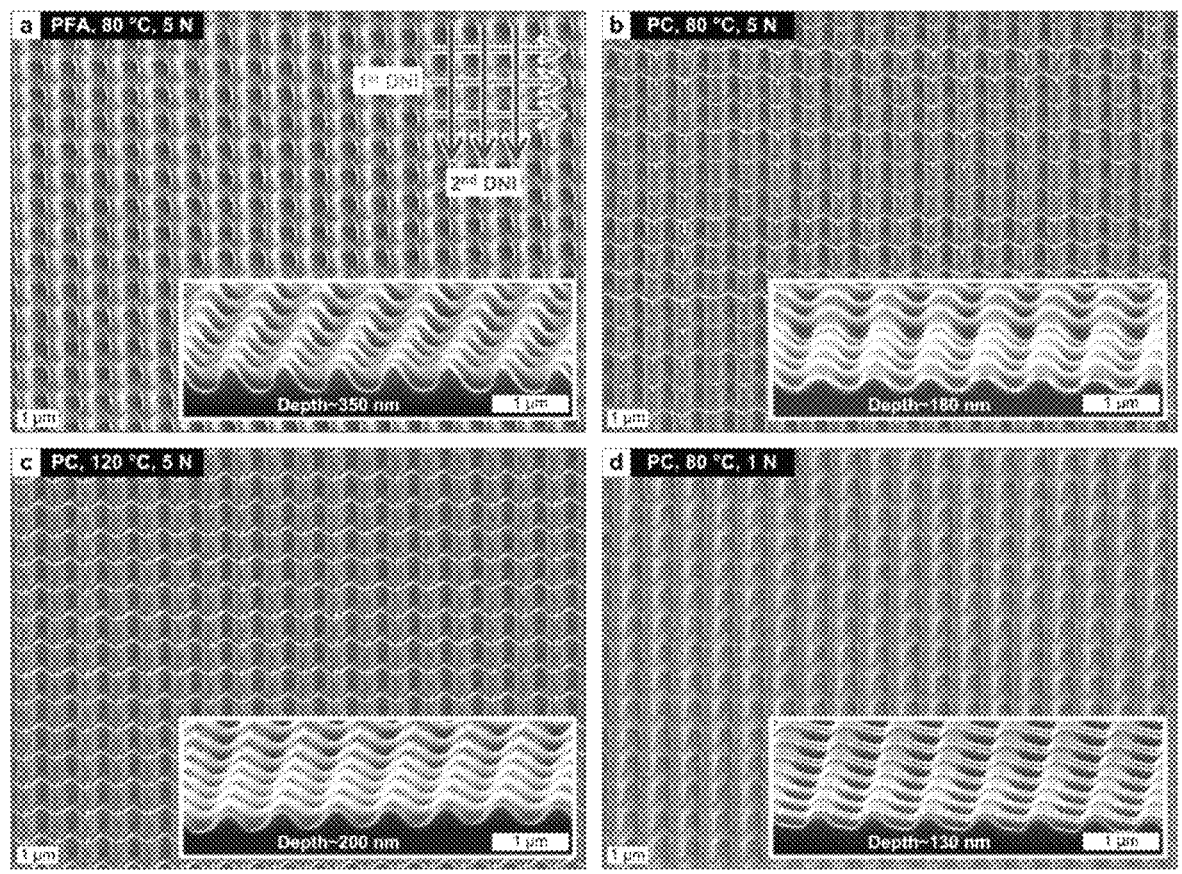

FIGS. 5A-5D show SEM images of two-dimensional nanopatterns formed with the dynamic nanoinscribing in accordance with certain aspects of the present disclosure, including magnified side views in each inset. The grating in FIG. 5A is formed via dynamic nanoinscribing on a perfluoroalkoxy (PFA) substrate at 80° C. and with 5N of applied force and has a depth of 350 nm. FIG. 5B shows a polycarbonate (PC) substrate dynamically inscribed at 80° C. with 5N of applied force and a depth of 180 nm. FIG. 5C shows a PC substrate dynamically inscribed at 120° C. and 5N of applied force with a depth of 200 nm. FIG. 5D shows a PC substrate dynamically inscribed at 80° C. and 1N of applied force with a depth of 130 nm. Scale bars are 1 μm.

Figures 6A, 6B, 6C, 6D:
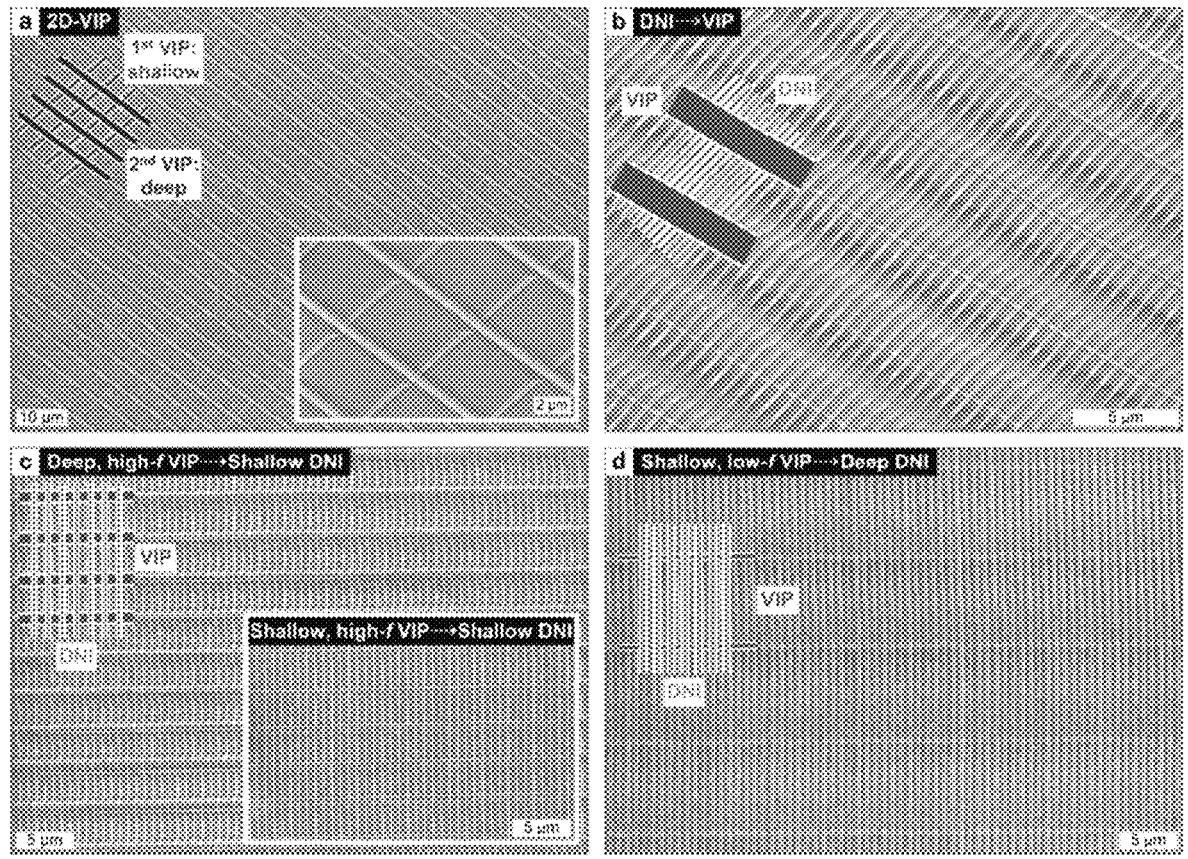

FIGS. 6A-6D show SEM images of two-dimensional nanopatterns formed with the vibrational indentation patterning in accordance with certain aspects of the present disclosure. Schematic illustrations over the SEM images show patterning sequences. FIG. 6A shows a two-dimensional vibrational indentation patterning at a 45° tilted view on polyethylene terephthalate (PET), where a first direction of VIP is a shallow pass with relatively low applied pressure, while a second orthogonal direction is a deeper pass with greater applied pressure. Scale bar is 10 µm. The inset of FIG. 6A shows a detailed view with a scale bar of 2 µm. FIG. 6B shows two-dimensional patterning on polycarbonate (PC), where the first direction of patterning is done by dynamic inscribing (DNI) and the second orthogonal direction of patterning is done by vibrational indentation patterning (VIP). Scale bar is 5 FIG. 6C is a top view of two-dimensional patterning under different conditions on PC, where the first direction of patterning is done by vibrational indentation patterning (VIP) and the second orthogonal direction of patterning is done by dynamic inscribing (DNI). A deep high-frequency VIP followed by a shallow DNI step is shown in FIG. 6C, while the inset shows an SEM of a two-dimensional pattern formed by a shallow, high-frequency VIP step followed by a shallow DNI step. Scale bars are 5 µm. FIG. 6D is a top view of two-dimensional patterning, where the first direction of patterning is done by a shallow, low-frequency, vibrational indentation patterning (VIP) followed by the second orthogonal direction of patterning of deep dynamic inscribing (DNI). Scale bar is 5 µm. All VIP processing temperatures for forming the patterns are at room temperature and all DNI processing temperatures are at 120° C.

Figures 7A, 7B:
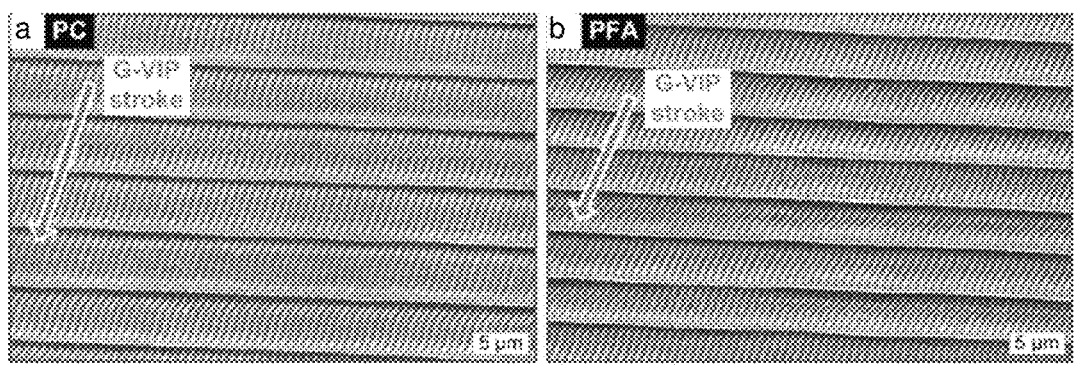

FIGS. 7A-7B show SEM images of two-dimensional nanopatterns formed with the grating-vibrational indentation patterning (G-VIP) techniques where a grating mold edge makes periodical indentations over the moving substrate to realize two-dimensional patterns in one stroke according to certain aspects of the present disclosure. FIG. 7A shows a G-VIP patterned polycarbonate (PC) substrate, while FIG. 7B shows a G-VIP perfluoroalkyl (PFA) substrate with directions marked. Scale bars are 5 µm.

Figure 8A:
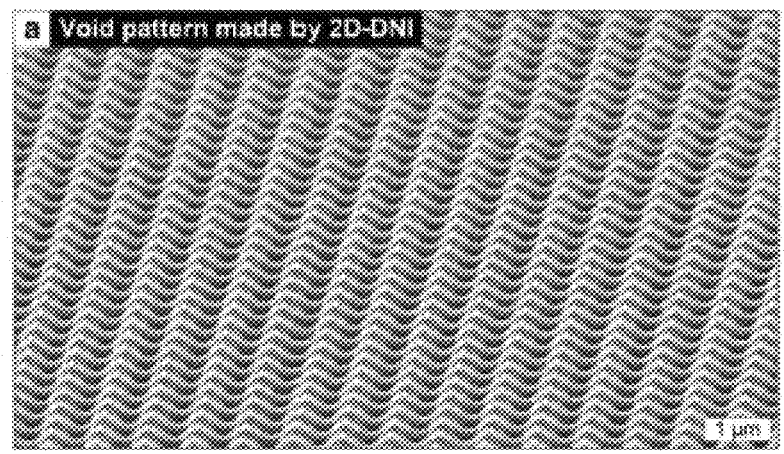
Figure 8B:
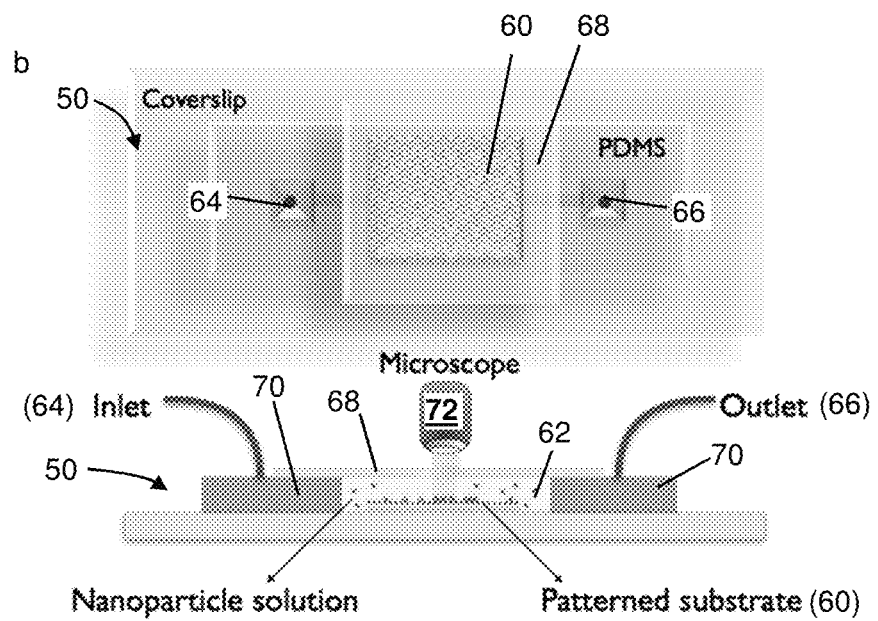
Figure 8C:
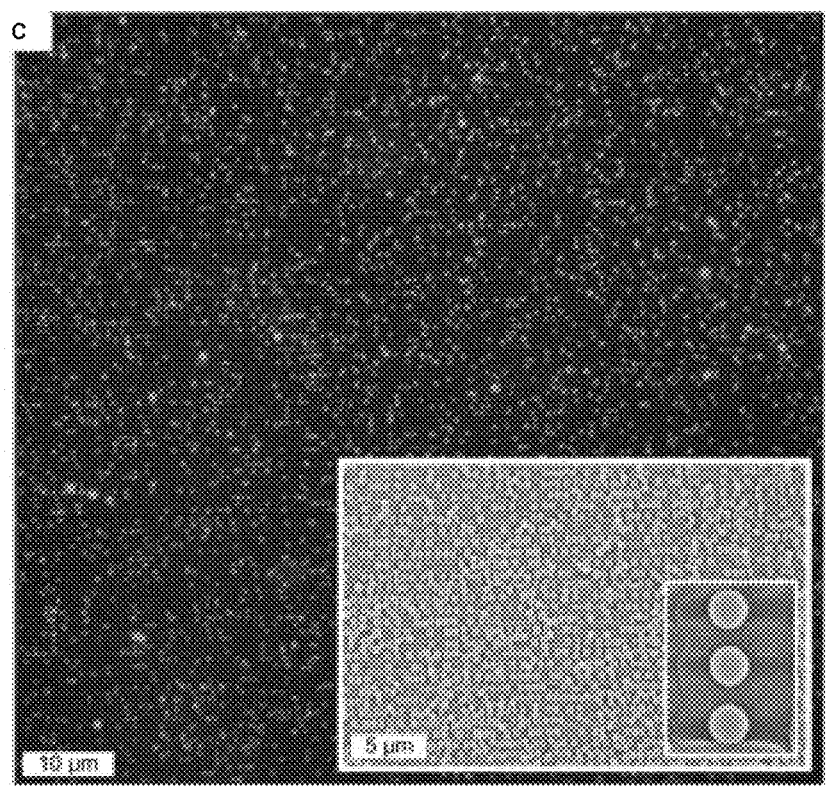
Figure 8D:
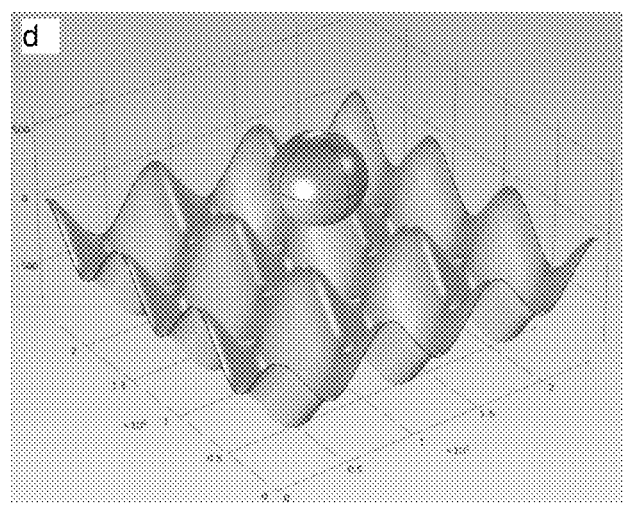

FIGS. 8A-8D. FIG. 8A shows a two-dimensional nanopattern having a 700 nm period void pattern formed with a dynamic nanoinscribing (DNI)-DNI pattern on a polycarbonate (PC) substrate in accordance with certain aspects of the present disclosure. FIG. 8B shows a schematic of a top view and side view of a fluidic cell chamber including a substrate patterned in accordance with certain aspects of the present disclosure. The microfluidic cell contains a two-dimensional DNI-DNI pattern like that in FIG. 8A coated with a 10 nm thick $Al_2O_3$ coating. A suspension of nanoparticles (e.g., polystyrene nanoparticles) is injected into the cell immersed in a solution (e.g., NaCl solution), while a microscope monitors and records the motion of the NPs. FIG. 8C shows epifluorescence microscopic images of nanoparticles (e.g., polystyrene nanoparticles) docked in the $Al_2O_3$-coated two-dimensional DNI-DNI framework (scale is 10 µm). The inset in FIG. 8C shows SEM images taken after the sample is dried, where the enlarged view in the lower-right corner shows three nanoparticles confined in three grooves in series (scale is 5 µm). FIG. 8D shows simulation characteristics as a nanoparticle descends in the z-direction into the nanovoid of a patterned surface prepared in accordance with certain aspects of the present disclosure.

Figures 9A, 9B, 9C, 9D, 9E:
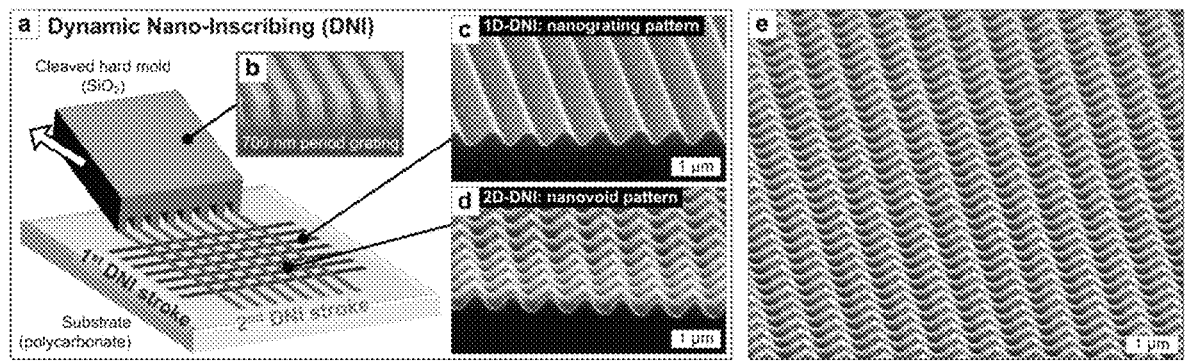

FIGS. 9A-9E. FIG. 9A is a schematic illustration of a dynamic nano-inscribing (DNI) process for a single-stroke one dimensional (1D) nanopatterning or two-dimensional (2D) nanopatterning by sequential combination. A well-cleaved edge of a 700 nm-period nanograting mold formed of $SiO_2$ is used to create the nanopattern. FIG. 9B shows an SEM image of a side view of the patterned surface of the nanograting mold with the 700 nm period grating. FIG. 9C shows a continuously-created 1D grating formed after the nanograting mold contacts and slides over a polymeric substrate under a conformal contact and localized heating. FIG. 9D shows a 2D nanovoid pattern formed from a nanograting mold (scale bar 1 µm). FIG. 9D shows well-defined sinusoidal surface profiles (scale bar 1 µm). FIG. 9E is a perspective view of an SEM of 2D-DNI-fabricated nanovoid arrays.

Figures 10A, 10B, 10C, 10D:
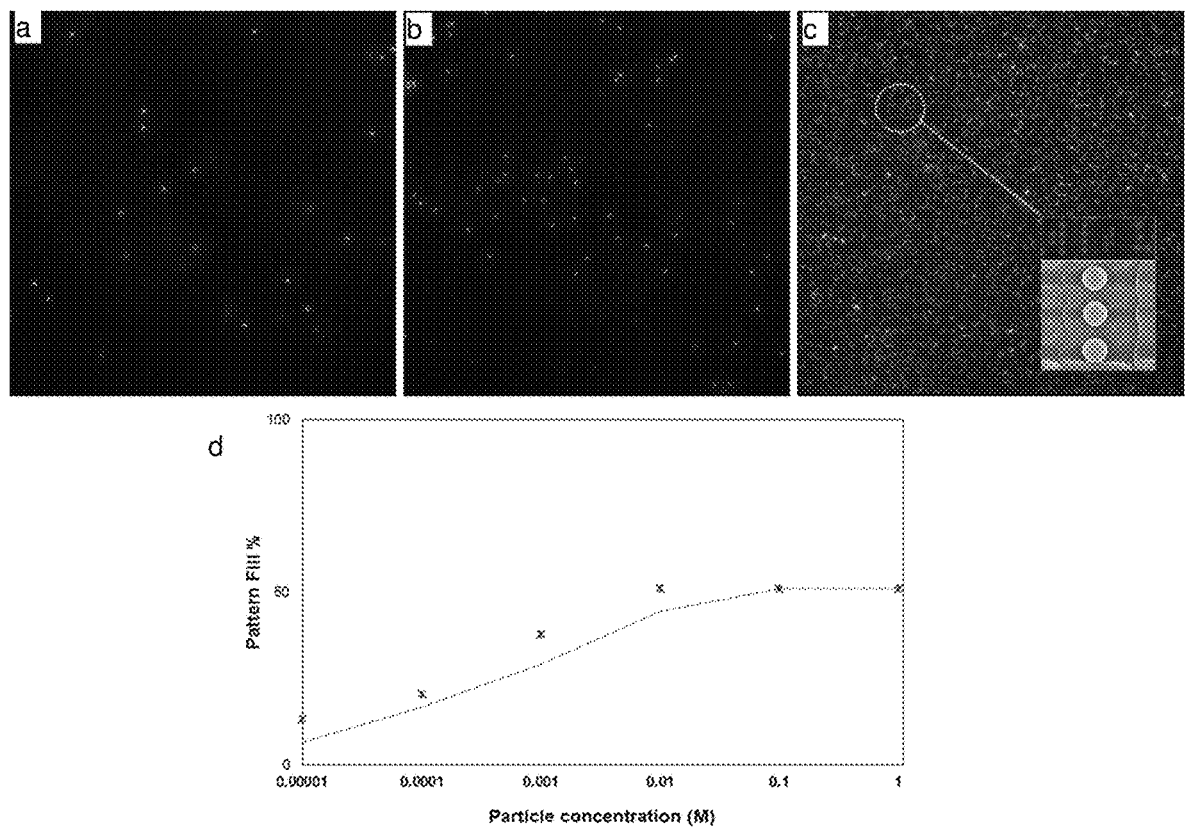

FIGS. 10A-10D. FIGS. 10A-10C show particle directed assembly including an epi-fluorescent micrograph of 500 nm diameter particles assembling on: an unpatterned, uncoated polycarbonate substrate (FIG. 10A), an unpatterned, 10 nm $Al_2O_3$ coated polycarbonate substrate (FIG. 10B), and a patterned substrate coated with 10 nm $Al_2O_3$ (FIG. 10C). The inset in FIG. 10C charts zoom-in microscopy and SEM images of the trapped nanoparticles. FIG. 10D shows a nanovoid fill ratio as a function of the particle concentration. The diameter of the particles is 500 nm.

Figures 11A, 11B, 11C, 11D, 11E, 11F:
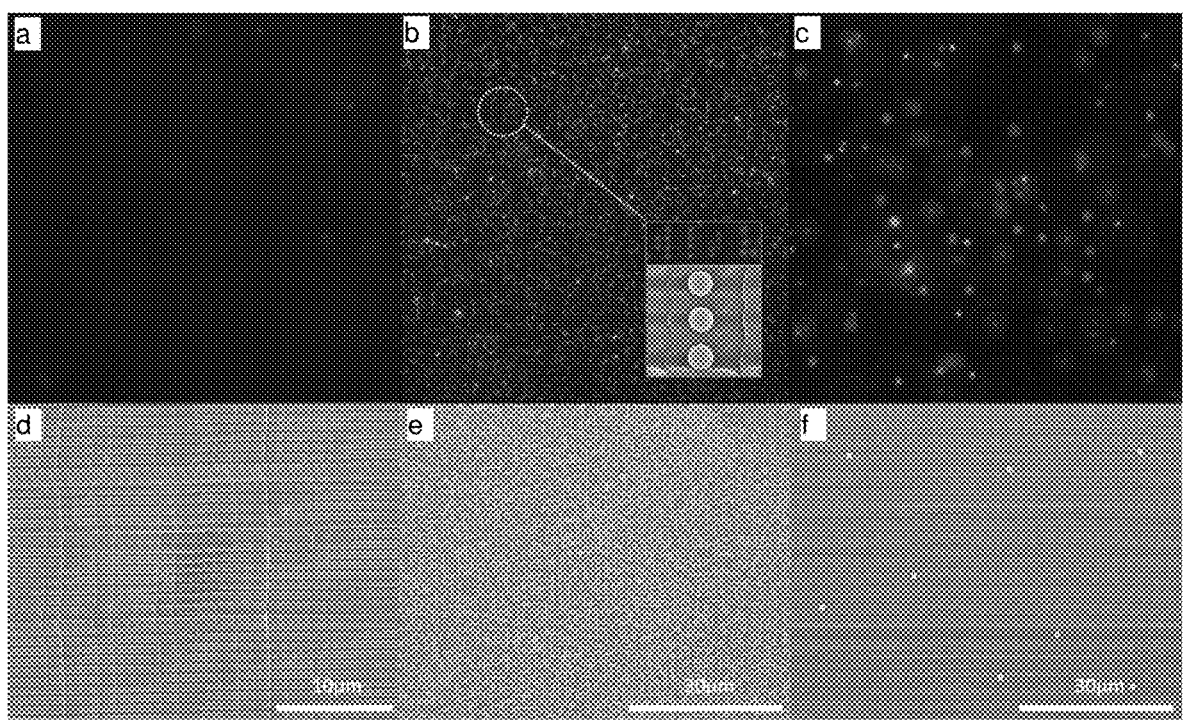

FIGS. 11A-11F. Size-selected trapping of nanoparticles on patterned surfaces formed in accordance with certain aspects of the present disclosure are shown. Microscope and SEM images of the nanoparticles trapped to the patterned structure for 200 nm particles (FIGS. 11A and 11D), 500 nm particles (FIGS. 11B and 11E), 1 µm particles (FIGS. 11C and 11F). The inset picture in FIG. 11B shows the zoomed-in view of the trapped particles.

Figures 12A, 12B, 12C, 12D, 12E, 12F:
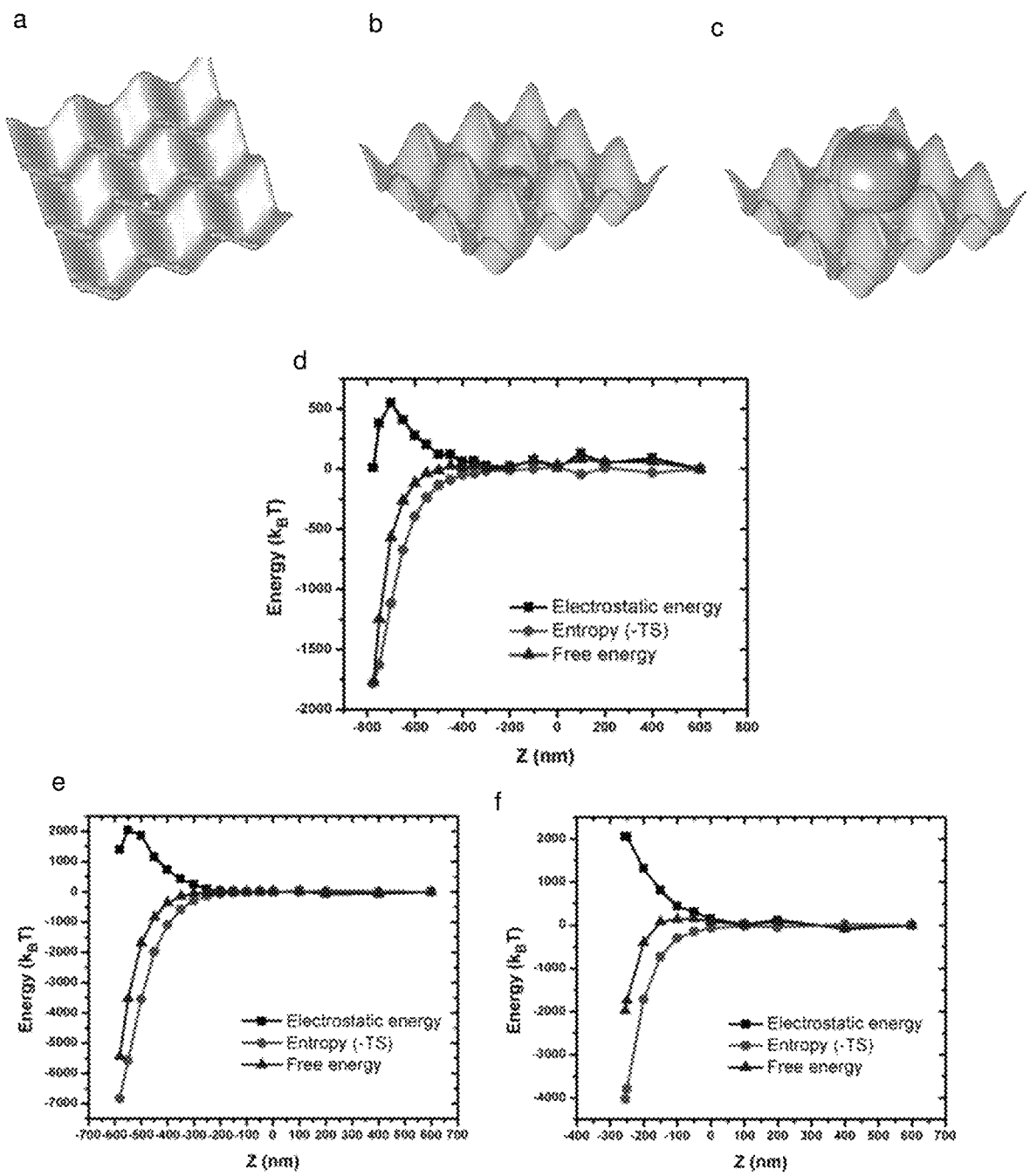

FIGS. 12A-12F. Energy profiles of the traps are shown. In FIGS. 12A-12C, the geometry of the particles at the lowest positions in the voids for 200 nm (FIG. 12A), 500 nm (FIG. 12B), and 1 µm (FIG. 12C) particles are shown, respectively. FIGS. 12D-12F show calculated energy change of the system, when particles are approaching the bottom of the void in z-direction for 200 nm (FIG. 12D), 500 nm (FIG. 12E) and 1 µm (FIG. 12F) diameter particles respectively.

Figures 13A, 13B:
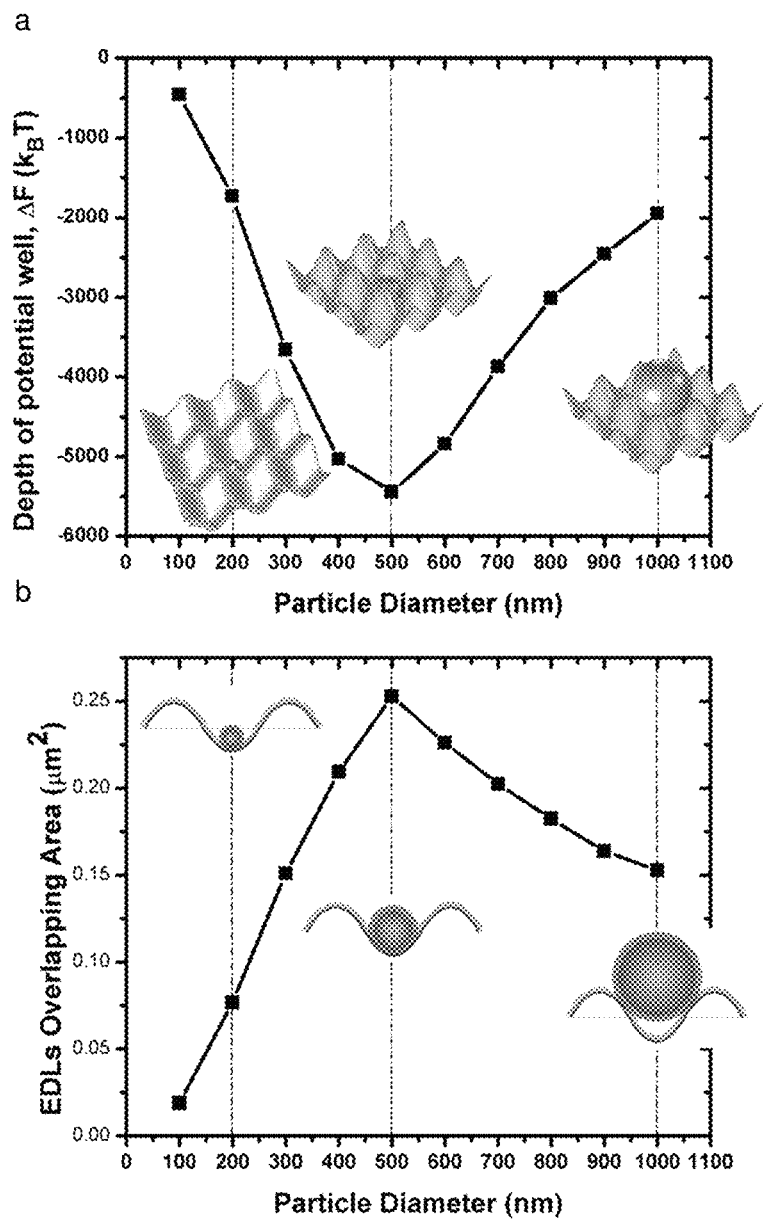

FIGS. 13A-13B. Size-selectivity is explored. FIG. 13A shows a depth of the free energy potential well for nanoparticles particles in nanovoids having different sizes. The insets show the geometry of the nanovoids and particles at the lowest positions in the voids. FIG. 13B shows electric double layers (EDLs) of overlapping areas for particles in the voids with different sizes. The insets show the schematics of EDLs overlapping when particles are located at the lowest positions in the voids for 200 nm, 500 nm and 1 µm particles. Only particles with particular sizes fitting the void geometry well can obtain largest EDLs overlapping areas.

Corresponding reference numerals indicate corresponding parts throughout the several views of the drawings.

DETAILED DESCRIPTION

Example embodiments are provided so that this disclosure will be thorough, and will fully convey the scope to those who are skilled in the art. Numerous specific details are set forth such as examples of specific compositions, components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, elements, compositions, steps, integers, operations, and/or components, but do not preclude the presence or addition of one or more other features, integers, steps, operations, elements, components, and/or groups thereof. Although the open-ended term "comprising," is to be understood as a non-restrictive term used to describe and claim various embodiments set forth herein, in certain aspects, the term may alternatively be understood to instead be a more limiting and restrictive term, such as "consisting of" or "consisting essentially of." Thus, for any given embodiment reciting compositions, materials, components, elements, features, integers, operations, and/or process steps, the present disclosure also specifically includes embodiments consisting of, or consisting essentially of, such recited compositions, materials, components, elements, features, integers, operations, and/or process steps. In the case of "consisting of," the alternative embodiment excludes any additional compositions, materials, components, elements, features, integers, operations, and/or process steps, while in the case of "consisting essentially of" any additional compositions, materials, components, elements, features, integers, operations, and/or process steps that materially affect the basic and novel characteristics are excluded from such an embodiment, but any compositions, materials, components, elements, features, integers, operations, and/or process steps that do not materially affect the basic and novel characteristics can be included in the embodiment.

Any method steps, processes, and operations described herein are not to be construed as necessarily requiring their performance in the particular order discussed or illustrated, unless specifically identified as an order of performance. It is also to be understood that additional or alternative steps may be employed, unless otherwise indicated.

When a component, element, or layer is referred to as being "on," "engaged to," "connected to," or "coupled to" another element or layer, it may be directly on, engaged, connected or coupled to the other component, element, or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various steps, elements, components, regions, layers and/or sections, these steps, elements, components, regions, layers and/or sections should not be limited by these terms, unless otherwise indicated. These terms may be only used to distinguish one step, element, component, region, layer or section from another step, element, component, region, layer or section. Terms such as "first," "second," and other numerical terms when used herein do not imply a sequence or order unless clearly indicated by the context. Thus, a first step, element, component, region, layer or section discussed below could be termed a second step, element, component, region, layer or section without departing from the teachings of the example embodiments.

Spatially or temporally relative terms, such as "before," "after," "inner," "outer," "beneath," "below," "lower," "above," "upper," and the like, may be used herein for ease of description to describe one element or feature's relationship to another element(s) or feature(s) as illustrated in the figures. Spatially or temporally relative terms may be intended to encompass different orientations of the device or system in use or operation in addition to the orientation depicted in the figures.

The size of the elements or the relative size between the element or elements in the figures may be shown to be exaggerated for more clear understanding of the invention. In addition, the shape of the elements shown in the figures may be somewhat changed by the variation of the manufacturing process or the like. Accordingly, the embodiments described herein and should not be limited to the shape shown in the drawings unless otherwise stated, it shall be understood to include a certain amount of variation.

Throughout this disclosure, the numerical values represent approximate measures or limits to ranges to encompass minor deviations from the given values and embodiments having about the value mentioned as well as those having exactly the value mentioned. Other than in the working examples provided at the end of the detailed description, all numerical values of parameters (e.g., of quantities or conditions) in this specification, including the appended claims, are to be understood as being modified in all instances by the term "about" whether or not "about" actually appears before the numerical value. "About" indicates that the stated numerical value allows some slight imprecision (with some approach to exactness in the value; approximately or reasonably close to the value; nearly). If the imprecision provided by "about" is not otherwise understood in the art with this ordinary meaning, then "about" as used herein indicates at least variations that may arise from ordinary methods of measuring and using such parameters. For example, "about" may comprise a variation of less than or equal to 5%, optionally less than or equal to 4%, optionally less than or equal to 3%, optionally less than or equal to 2%, optionally less than or equal to 1%, optionally less than or equal to 0.5%, and in certain aspects, optionally less than or equal to 0.1%.

In addition, disclosure of ranges includes disclosure of all values and further divided ranges within the entire range, including endpoints and sub-ranges given for the ranges.

Example embodiments will now be described more fully with reference to the accompanying drawings.

Beyond uniaxial nanostructures, such as nanogratings or one-dimensional (1D) nanomaterials (e.g., nanowires and nanotubes), multi-dimensional nanoarchitectures integrating micro/nano-scale features are desirable and their application has permeated into many interdisciplinary fields.

Continuous mechanical nanopatterning methods, such as dynamic nanoinscribing (DNI) and vibrational indentation patterning (VIP), roll-to-roll nanoimprinting (R2RNIL), and localized dynamic wrinkling (LDW) enable the continuous and high-speed fabrication of micro/nano-grating patterns with simple setups and without the need for intricate masks; DNI inscribes, VIP indents, R2RNIL imprints micro/nano-scale grating patterns very easily on flexible substrates.

In certain aspects, the present disclosure provides a unique combination of these patterning techniques, a new process is provided for the continuous and scalable "direct-writing" of two-dimensional (2D) micro/nano-patterns. The present disclosure also contemplates is a "single-stroke" 2D patterning by adapting the grating-containing DNI tool as a vibrating edge in the VIP process. Because both DNI and VIP are fully capable of period control, a variety of large-area 2D patterns of desired dimensions can be continuously written on any substrates softer than the writing tool. In certain aspects, the present disclosure provides new 2D patterns of arrays of microvoids or nanovoids, including sinusoidal microvoid or nanovoid patterns. Further, microfluidic devices incorporating substrates having such 2D patterns are provided that can enable size selective separation and assembly of nanomaterials and colloidal materials, such as nanoparticles, cells, and the like.

Thus, the present disclosure contemplates scalable fabrication of multidimensional nanopatterns via sequential combination of continuous one-dimensional nanopatterning strokes. A versatile and simple methodology is thus provided for continuous and scalable 2D micro/nano-structure fabrication via sequential 1D patterning strokes enabled by dynamic nano-inscribing (DNI) and vibrational indentation patterning (VIP) as well as a "single-stroke" 2D patterning using a new tool that has a patterned grating edge enabling a new grating-vibrational indentation patterning process (G-VIP). Various applications requiring 2D micro/nano-patterns with good scalability and reproducibility can make use of this technique.

In certain aspects, a method of forming the two-dimensional nanopatterns includes a step to form a pattern on the substrate using at least one process selected from dynamic nanoinscribing using a first mold and vibrational indentation patterning using a second mold.

The term dynamic nanoinscribing used herein means method of forming a pattern by continuously contacting an edge of a mold or tool with a moving substrate. Vibrational indentation patterning means a method of forming a pattern by vertically vibrating an edge of a mold or tool and only periodically contacting the edge with a moving substrate as it passes by.

Figure 1:
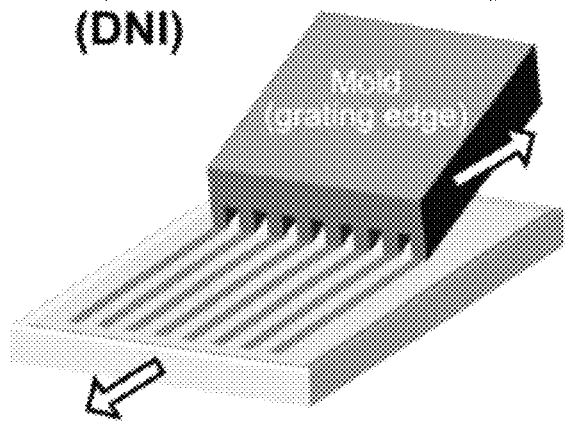

FIG. 1 shows micro-patterning using dynamic nanoinscribing. As shown in FIG. 1, the dynamic nanoinscribing (Dynamic Nano Inscribing, DNI) uses a sharp edge of a hard grating mold or tool to inscribe a pattern onto a polymer substrate by plastically deforming it. The mold edge can be locally heated to control the degree of plastic deformation of the substrate at contact, thereby tailoring the resulting pattern geometry. The mold or tool may have a patterned contact surface that defines a plurality of distinct rows (or peaks) and a plurality of troughs (or valleys) interspersed therebetween. The pattern may thus define multiple separate distinct lines.

The substrate may be a polymeric substrate. In certain aspects, the substrate may be a polymeric substrate selected from the group consisting of: polyethylene terephthalate (PET), polycarbonate (PC), phenol formaldehyde resins (PF), perfluoroalkoxy (PFA), and combinations thereof. However, other substrates that are softer than the mold tool and undergo plastic deformation are also contemplated and may be used.

The mold tools may be formed from fabricated polymer patterns that are transferred onto silicon (Si) wafers using UV-curable epoxysilicone resin.

The dynamic nanoinscribing can form a line type pattern by bringing the mold edge in contact with the substrate at a predetermined angle. A slight normal force and local heating can be applied to the mold tool if necessary, and then the mold edge is slid over the substrate in a first direction while the conformal contact is maintained.

As a result, the pattern is continuously inscribed on a substrate without seams until the process ends. The dynamic nanoinscribing enables indefinite large area patterning irrespective of the mold area. Mesh patterns can be formed by performing two dynamic nanoinscribing processes in series along two different directions at an angle to one another, for example, along orthogonal directions with a 90° angle in between.

Figure 2A:
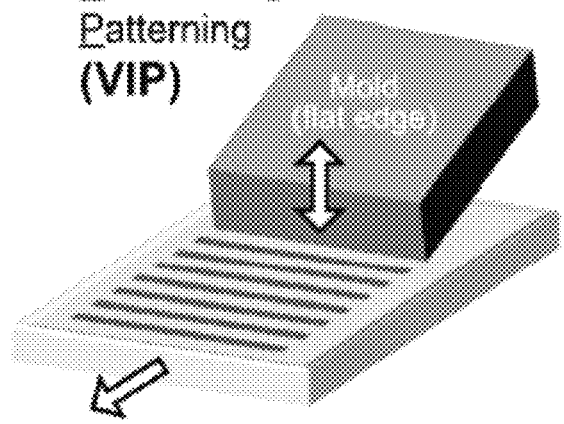
Figure 2A:
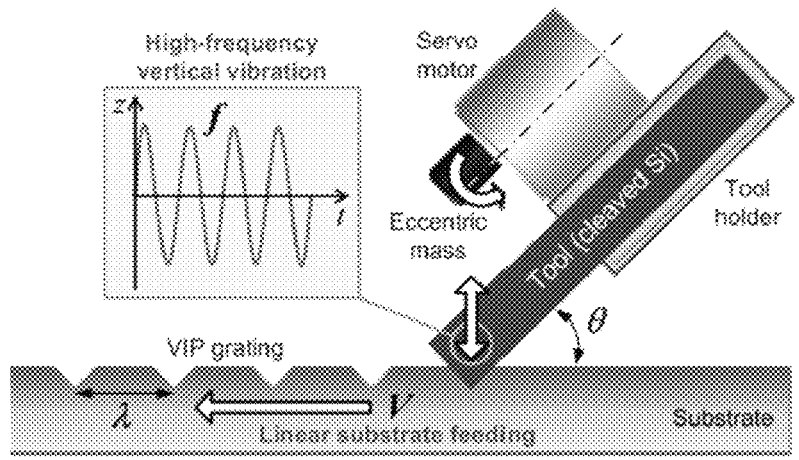

FIGS. 2A-2B show micro-patterning using vibrational indentation patterning in accordance with other aspects of the present disclosure. As shown in FIG. 2A, the vibrational indentation patterning (Vibrational Indentation Patterning, VIP) utilizes vertical vibration of a flat, continuous, sharp edge of a rigid tool, which makes periodic indentations onto a moving substrate with a controlled gap from the tool. FIG. 2B shows the overall VIP process where the vertically vibrating flat tool edge periodically (or intermittently) indents line patterns on a linearly moving substrate beneath the tool edge. The controlled vibration is generated by operating a high-speed servo motor with a mass eccentrically mounted on the spindle head. The tool is arranged in a tool holder that is disposed at an angle ($\Theta$) with respect to the linear substrate. A direction of the substrate as it is fed into the device is shown along with a velocity (V). The frequency (f) of the vibration impacts the periodicity of the spacing between indentations (shown as wavelength—$\lambda$), as does the substrate velocity (V) of the passing substrate. Thus, a period is generally the interval/distance between a first feature and a second feature in the same pattern. The period control in VIP is possible simply by adjusting the vibration frequency and/or substrate moving speed. The pattern may form a plurality of parallel and spaced apart lines. As noted above, the polymer substrate may include polyethylene terephthalate (PET), polycarbonate (PC), phenol formaldehyde resins (PF), and/and perfluoroalkoxy (PFA), by way of example. The fabricated polymer patterns may be transferred onto silicon (Si) wafers using UV-curable epoxysilicone resin.

The vibrational indentation patterning can be an even more economical process than the dynamic nanoinscribing as it uses simple molds with a flat edge. By vertically vibrating a flat, sharply-cleaved mold (e.g., formed of $Si_3N_4$) tilted at the desired angle (e.g., 45°) over a horizontally-moving substrate with lesser hardness, periodic gratings or lines with arbitrary spacing can be "indented" in a continuous manner. Mesh patterns or gratings with intersecting lines can be formed by performing two vibrational indentation patterning processes with same frequency and force in series along two different directions, for example, along orthogonal directions.

The two-dimensional pattern may be formed by dynamic nanoinscribing, so that morphology of the pattern can be controlled by controlling the force applied to the substrate and the mold or tool and the temperature of the edge of the mold or tool in contact with the substrate.

The two-dimensional pattern may also be formed by vibrational indentation patterning, so that morphology of the pattern can be controlled by controlling the vibration frequency and amplitude of the mold or tool, the moving speed of the substrate and the gap between the mold or tool and the substrate.

Where the 2D pattern is formed by the vibrational indentation patterning, the VIP mold or tool may have multiple edges that are spaced apart from each other, as will be described further below.

FIGS. 4A-4D shows examples of two-dimensional micro-patterning according to certain aspects of the present disclosure. As shown in FIGS. 4A-4D, various forms of two-dimensional nanopatterns can be formed by performing dynamic nanoinscribing and vibrational indentation patterning steps twice in different directions. Various forms of two-dimensional nanopatterns can be formed by performing one of the dynamic nanoinscribing or the vibrational indentation patterning in the first direction relative to the polymer substrate, and performing one of the dynamic nanoinscribing or the vibrational indentation patterning in the second direction relative to the polymer substrate, orthogonal to the first direction.

The step of forming the 2D pattern may include, forming a first pattern by performing one of the dynamic nanoinscribing or the vibrational indentation patterning in a first direction relative to the substrate, and forming a second pattern by performing one of the dynamic nanoinscribing or the vibrational indentation patterning in a second direction at an angle with respect to the first direction. In certain aspects, the first direction may be at an angle of 90° to the second direction and therefore the directions are orthogonal to one another.

Figures 4A, 4B, 4C, 4D:
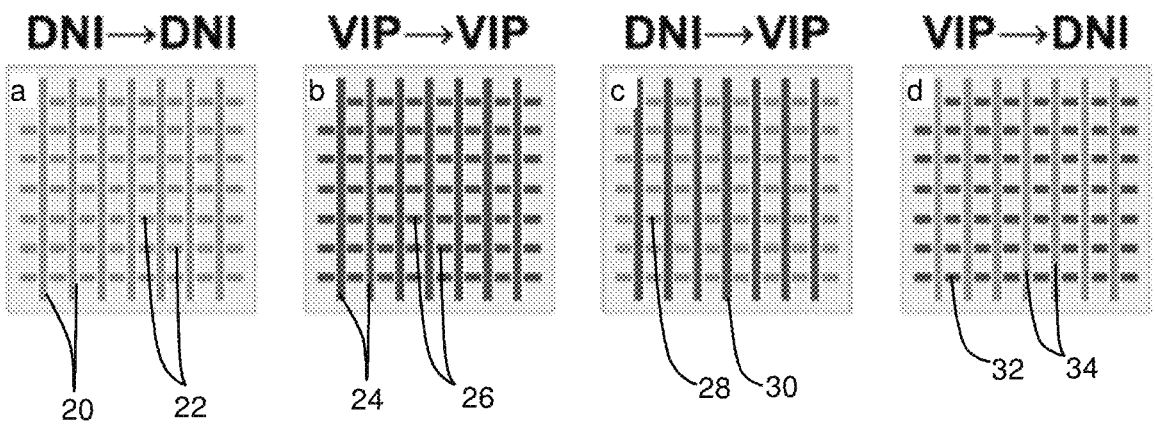
FIGS. 4A-4D show two-dimensional nanopatterns formed in accordance with certain aspects of the present disclosure.

As shown in FIG. 4A, forming the pattern may include forming a first pattern 20 by performing dynamic nanoinscribing (DNI) in a first direction relative to the substrate, and forming a second pattern 22 by performing dynamic nanoinscribing in a second direction disposed at an angle to the first direction. In certain aspects, the first direction may be at an angle of 90° to the second direction and therefore the directions are orthogonal to one another.

As shown in FIG. 4B, forming the pattern may include forming a first pattern 24 by performing vibrational indentation patterning in the first direction relative to the substrate, and forming second pattern 26 by performing vibrational indentation patterning in the second direction at an angle to the first direction. In certain aspects, the first direction may be at an angle of 90° to the second direction and therefore the directions are orthogonal to one another.

As shown in FIG. 4C, forming the pattern may also include forming a first pattern 28 by performing dynamic nanoinscribing in a first direction relative to the substrate, and forming a second pattern 30 by performing vibrational indentation patterning in the second direction at an angle to the first direction. In certain aspects, the first direction may be at an angle of 90° to the second direction and therefore the directions are orthogonal to one another.

As shown in FIG. 4D, forming the pattern may further include forming a first pattern 32 by performing vibrational indentation patterning in the first direction relative to the substrate, and forming a second pattern 34 by performing the dynamic nanoinscribing in the second direction at an angle to the first direction. In certain aspects, the first direction may be at an angle of 90° to the second direction and therefore the directions are orthogonal to one another.

The two-dimensional nanopatterns according to certain aspects of the present disclosure can be formed by any of the methods described above. In certain aspects, the two-dimensional micro-pattern may be a two-dimensional sinusoidal pattern.

In certain aspects, a 2D pattern may by created by forming a first pattern by performing a first mechanical patterning step selected from the group consisting of: dynamic nanoinscribing (DNI), roll-to-roll nanoimprinting (R2RNIL), localized dynamic wrinkling (LDW), and vibrational indentation patterning (VIP) in a first direction. A second pattern can be performing by a second mechanical patterning step selected from the group consisting of: dynamic nanoinscribing (DNI), roll-to-roll nanoimprinting (R2RNIL), localized dynamic wrinkling (LDW), and vibrational indentation patterning (VIP) in a second direction that is at an angle with respect to the first direction. In certain aspects, the first direction may be at an angle of 90° to the second direction and therefore the directions are orthogonal to one another.

The two-dimensional nanopatterning method according to embodiments of the present disclosure can form two-dimensional nano-patterns by performing a combination of the dynamic nanoinscribing, roll-to-roll nanoimprinting, localized dynamic wrinkling, and the vibrational indentation patterning. Large-area two-dimensional nanopatterns can be formed easily and quickly. By applying the two-dimensional nanopatterns, template, and the part that can be used in various fields such as electronics, photonics, and bio-engineering can be easily prepared at high production rates.

In certain aspects, the method of forming a 2D pattern may include forming a first pattern by performing a first mechanical patterning step selected from the group consisting of: dynamic nanoinscribing (DNI), roll-to-roll nanoimprinting (R2RNIL), localized dynamic wrinkling (LDW), and vibrational indentation patterning (VIP) in a first direction. A second pattern can then be formed by selecting a distinct patterning step selected from the group consisting of: dynamic nanoinscribing (DNI), roll-to-roll nanoimprinting (R2RNIL), localized dynamic wrinkling (LDW), and vibrational indentation patterning (VIP) in a second direction at an angle to the first direction. In certain aspects, the first direction may be at an angle of 90° to the second direction and therefore the directions are orthogonal to one another. In this manner, the 2D pattern is formed by two distinct 1D patterning techniques.

In certain aspects, the materials used by certain patterning processes to form the first pattern in the first direction, for example, R2RNIL or DNI, may be UV or thermal setting materials. Thus, it is advantageous after this first pattern has been formed to use a second, distinct patterning process to produce the second pattern, which may desirably be under very different processing conditions than the first patterning process conditions. By way of non-limiting example, if the first pattern in a first direction is done by UV cured R2RNIL, a second pattern in a second direction would need to be made by DNI, VIP or thermal cured R2RNIL. Also, for LDW, two layers with different modulus levels are typically used, therefore if the first layer is done by one of the processes, in order to use LDW, a second thin top layer having different properties will need to be created.

Figure 3:
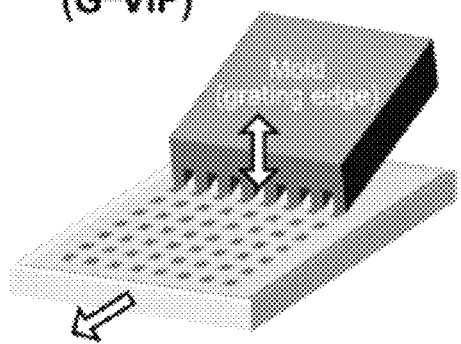
FIG. 3 shows a two-dimensional nanopattern formed with a single step combined grating-vibrational indentation patterning (G-VIP) technique in accordance with yet other aspects of the present disclosure.

FIG. 3 shows micro-patterning using grating-vibrational indentation patterning in accordance with an embodiment of the present disclosure. As shown in FIG. 3, a specialized tool is provided that enables grating-vibrational indentation patterning (Grating Vibrational Indentation Patterning, G-VIP) to form a periodic pattern on a moving polymer substrate by applying vertical vibration of multiple edges spaced apart.

In certain aspects, the present disclosure thus provides a method of forming a two-dimensional pattern on a substrate. The method comprises periodically contacting a vibrating tool comprising a patterned grating edge with a substrate along a first direction in a grating-vibrational indentation patterning process. In contrast to the previous VIP methods where the tool had a flat continuous edge, the edge of the tool is instead a patterned grating edge. Thus, the patterned grating edge of the tool defines a plurality of rows and a plurality of interspersed troughs. It should be noted that the shape of these rows and troughs is shown to be rectangular, although in alternative variations, other shapes may be contemplated. In this manner, the periodic contacting of the patterned grating edge and the substrate creates a two dimensional array of discontinuous voids in a single-stroke across the surface of the substrate. In certain variations, the tool is a cleaved hard mold tool comprising silicon dioxide ($SiO_2$). The substrate may be any substrate this is softer than the tool, for example, a polymeric substrate selected from the group consisting of: polyethylene terephthalate (PET), polycarbonate (PC), phenol formaldehyde resins (PF), and perfluoroalkoxy (PFA). The fabricated polymer patterns may be transferred onto Si wafers using UV-curable epoxy-silicone resin. In this manner, two-dimensional nanopatterns can be formed by single grating-vibrational indentation patterning stroke. Therefore, the overall manufacturing process of the two-dimensional pattern can be formed efficiently.

Because DNI, R2RNIL, LDW and VIP are based on mechanical deformation and fully capable of period control, the 2D patterns of various morphologies can be readily obtained through the combination of DNI and VIP as well as G-VIP on any substrate that is softer than the tool. Among the many potential applications, the use of such fabricated 2D patterns has been demonstrated for colloidal nanoparticle confinement, which can sort and trap various biological species including bacteria and circulating tumor cells. The excellent fabrication throughput of the present methods facilitates the use of multi-dimensional micro/nano-patterns in many applications that require large areas.

The technology may thus be used for various commercial nanopattern-based applications, particularly those requiring large-area and low-cost production, involving displays, flexible electronics, photonics, and bioengineering solutions, including microfluidic devices, by way of non-limiting example.

In certain aspects, a period between each row in a plurality of rows may be greater than or equal to about 50 nm.

FIGS. 5A-5D show SEM images of two-dimensional nanopattern formed by performing dynamic nanoinscribing according to certain aspects of the present disclosure. FIGS. 5A-5D thus show 2D nanopatterns, including a first pattern ($1^{st}$ DNI) and a second pattern ($2^{nd}$ DNI), formed via performing two DNI processes in series along orthogonal directions or at oblique angles. 700 nm period two-dimensional nanopatterns are formed by dynamic nanoinscribing with an $SiO_2$ mold having a 700 nm period (between rows or peaks). The morphologies of the 2D nanopatterns created by 2D-DNI can be specifically tailored by changing the substrate material, applied force, and processing temperature The grating in FIG. 5A is formed via dynamic nanoinscribing on a soft perfluoroalkoxy (PFA–Young's modulus E≈0.5 GPa) substrate at 80° C. and with 5N of load or applied force. The nanopattern thus has a depth of 350 nm. FIG. 5B shows a relatively hard polycarbonate (PC–Young's modulus E 2.3 GPa) substrate dynamically inscribed at 80° C. with 5N of applied force. A 180 nm deep 2D nanopattern is thus formed under same temperature and force as in FIG. 5A. FIG. 5C shows a 200 nm deep 2D nanopattern formed under same force where force is 5N, but the temperature is increased to 120° C. for same PC substrate as in FIG. 5C. FIG. 5D shows a PC substrate dynamically inscribed at 80° C., but with reduced load of only 1N of applied force. The 2D nanopattern thus only has a depth of 130 nm.

Generally, the first pattern ($1^{st}$ DNI) formed by the first dynamic nanoinscribing step can be slightly deformed by the second pattern ($2^{nd}$ DNI) formed by the second dynamic nanoinscribing step. However, because the mold openings (e.g., the troughs or valleys in the pattern) do not touch the patterned surface during the second dynamic nanoinscribing step, overall 2D "waffle-like" patterns emerge, as can be seen in FIGS. 5A-5D.

The profile of the two-dimensional nanopattern can be controlled by changing the substrate material, force, or temperature. The DNI pattern profile largely depends on the plastic deformation of a substrate induced by the mechanical stress from the edge of the mold under conformal contact. Hence, polymers that have a certain level of compliance, relatively low modulus, and a reasonable glass transition temperature ($T_g$; PFA~90° C., PC~140° C., for example, a $T_g$ of greater than or equal to about 80° C. to less than or equal to about 150° C.) are best suited as substrates for DNI processing. The modulation of the mechanical force and the processing temperature at the mold-substrate contact zone allows control of the degree of substrate deformation, namely, the final 2D pattern topology.

FIGS. 6A-6D show SEM images of two-dimensional nanopatterns formed with the vibrational indentation patterning in accordance with certain aspects of the present disclosure. All VIP processing temperatures for forming the patterns are at room temperature and all DNI processing temperatures are at 120° C. The period and depth of pattern formed by vibrational indentation patterning can be controlled by regulating the vibration frequency (f), substrate feeding speed (V), vibration amplitude (z), and the mold-substrate gap (g); for the 45°-tilted tool vibration, the pattern period λ and depth d are given as λ=V/f and d=z−g, respectively. (See FIG. 2B above).

FIG. 6A shows a two-dimensional vibrational indentation patterning at a 45° tilted view on polyethylene terephthalate (PET), where a first direction of VIP is a shallow pass with relatively low applied pressure, while a second orthogonal direction is a deeper pass with greater applied pressure. Thus, two consecutive vibrational indentation patterning steps are conducted in different directions. The two-dimensional nanopatterns have different depth per direction, where a first pattern ($1^{st}$ VIP) is shallow and a second patter is deep ($2^{nd}$ VIP) of 5 µm distance. In addition, the two-dimensional nanopatterns can be formed with 5 µm gap with 50 Hz (3000 rpm) frequency (f) with the substrate moving speed of 250 µm/s (V). Because a uniform contact between vibrating mold edge and the substrate is desirable to form a uniform line pattern, a flexible or soft polymer is preferably used. The vibrational indentation patterning can quickly and easily form a two-dimensional nanopatterns by using a high-frequency vibration.

FIG. 6B shows two-dimensional patterning on polycarbonate (PC), where the first direction of patterning is done by dynamic inscribing (DNI) and the second orthogonal direction of patterning is done by vibrational indentation patterning (VIP). To control the topology of the final two-dimensional nanopattern the dynamic nanoinscribing and the vibrational indentation patterning can be independently controlled.

FIG. 6C is a top view of two-dimensional patterning under different conditions on PC, where the first direction of patterning is done by vibrational indentation patterning (VIP) and the second orthogonal direction of patterning is done by dynamic inscribing (DNI). A deep high-frequency VIP followed by a shallow DNI step is shown in FIG. 6C, while the inset shows an SEM of a two-dimensional pattern formed by a shallow, high-frequency VIP step followed by a shallow DNI step. The two-dimensional nanopattern shown in FIG. 6C includes a 3 µm spaced deep first pattern (VIP) formed by vibrational indentation patterning and a shallow pattern (DNI) formed by dynamic nanoinscribing with force of 1N.

FIG. 6D is a top view of two-dimensional patterning, where the first direction of patterning is done by a shallow, low-frequency, vibrational indentation patterning (VIP) followed by the second orthogonal direction of patterning of deep dynamic inscribing (DNI). The two-dimensional nanopattern shown in FIG. 6D thus has a 7 μm spaced apart shallow first pattern (VIP) formed by low frequency vibrational indentation patterning and a deep pattern (DNI) formed by dynamic nanoinscribing with a force of 5N.

FIGS. 7A-7B show SEM images of two-dimensional nanopatterns formed with the grating-vibrational indentation patterning (G-VIP) techniques where a patterned grating mold edge makes periodic indentations over the moving substrate to realize two-dimensional patterns in one stroke according to certain aspects of the present disclosure. Thus, such a G-VIP process may use a mold like shown in FIG. 3 in a VIP device like that shown in FIG. 2B. FIG. 7A shows a G-VIP patterned polycarbonate (PC) substrate, while FIG. 7B shows a G-VIP perfluoroalkyl (PFA) substrate with directions marked.

FIGS. 7A-7B show the morphology of the pattern can be controlled to variety of shapes by changing the process conditions and the substrate material. By adjusting the substrate moving speed under the same oscillation frequency, 5 μm, spacing pattern is formed on PC substrate (FIG. 7A), while a 3.5 μm spacing pattern is formed on PFA substrate (FIG. 7B).

As described above, the templates and components for electronics, photonics and bio-engineering can be easily and with high productivity with the two-dimensional nanopatterns formed by combination of dynamic nanoinscribing and vibrational indentation patterning. Especially the two-dimensional nanopatterns can be applied to large area pattern required for biological applications such as filtration or particle manipulation systems.

FIG. 8A shows a two-dimensional nanopattern having a 700 nm period void pattern formed with a first dynamic nanoinscribing (DNI) pattern in a first direction followed by a second DNI pattern in a second orthogonal direction on a polycarbonate (PC) substrate in accordance with certain aspects of the present disclosure. The two-dimensional nanopattern includes complex planar nanostructures such as a 2D sinusoidal nanovoid pattern. A microvoid or nanovoid pattern as defined herein is not merely formed by a linear intersecting grid or mesh pattern, but rather is formed by certain patterning techniques described herein that create discrete arrays of open volume voids having at least one curved surface. In certain aspects, the nanovoids are contiguous with adjacent nanovoids and connected to one another due to being formed by a continuous mechanical patterning technique. In certain aspects, each void may define a curved shaped, for example, a pyramidal shape or a hemispherical shape, for example, when formed by a DNI-DNI patterning. In certain variations, the nanovoid pattern has a sinusoidal shape, as described further below.

As discussed below, the DNI-DNI process leaves certain structures intact due to the presence of openings in the grating of the mold structure as it inscribes in a second direction from the first direction. In other aspects, the voids may be significantly spaced apart from one another in an array when formed by a G-VIP grating technique. The volume of each nanovoid will depend upon the period of the patterning used in each direction and the depth of the pattern in each direction. In certain aspects, the pattern includes a plurality of rows defines a first period of greater than or equal to about 10 nm to less than or equal to about 10 μm in a first direction, optionally greater than or equal to about 50 nm to less than or equal to about 1 μm in a first direction, for example, about 700 nm. The pattern also includes a plurality of rows in a second direction that defines a second period of greater than or equal to about 10 nm to less than or equal to about 10 in a second direction, optionally greater than or equal to about 50 nm to less than or equal to about 1 μm in a second direction, for example, about 700 nm. Where the void pattern has at least one period of greater than or equal to about 1 it may be considered to be a microvoid, while a period of less than or equal to about 1 μm is a nanovoid.

A depth of the features or rows may be greater than or equal to about 100 nm to less than or equal to about 1 for example, about 800 nm deep. It is contemplated that for certain patterning techniques the periodicity and/or depth between rows can be varied along the patterned surface, so that different periods or depths result in different void volumes in different areas of the surface of the substrate, which may be capable of selectively associating with different shape and sized micro- and nanospecies. The 2D sinusoidal void pattern is capable of confining and manipulating charged micro/nano-scale entities including nanoparticles, lipid vesicles, cells, such as cancer cells and bacteria.

In certain aspects, the present disclosure provides a microfluidic device. FIG. 8B shows a schematic of a top view and side view of a fluidic device 50 including a substrate 60 patterned in accordance with certain aspects of the present disclosure. In certain aspects, the microfluidic device 50 comprises a substrate 60 comprising a surface defining a two-dimensional pattern of nanovoids. By way of non-limiting example, a DNI-DNI pattern can create two-dimensional sinusoidal pattern of nanovoids like that in FIG. 8A, which are particularly suitable for use as a patterned surface in a microfluidic device, as described further below. In certain aspects, the surface defining the pattern bears a charge or may comprise a charged coating. In certain variations, the charged coating comprises aluminum oxide ($Al_2O_3$).

The device 50 includes a compartment 62 for holding a fluid. The substrate 60 is disposed within the compartment 62 such that the patterned surface contacts the fluid. The fluid may be an ionic solution that includes the nanospecies distributed therein, and thus, may form a suspension. The compartment 62 includes an inlet 64 and an outlet 66, so that fluid is introduced to the compartment 62 via the inlet 64 and exits the compartment 62 via the outlet 66. The compartment 62 optionally comprises at least one transparent region 68 through which the substrate 60 can be viewed. Two lateral spacers 70, for example formed of polydimethylsiloxane (PDMS), can form the lateral walls of the compartment 62. As shown in FIG. 8B, a microscope 72 can be used to view the substrate 60 within the compartment through the transparent region 68 in the compartment 62.

The fluidic device 50 is merely exemplary and as shown includes the compartment 62 that defines a microfluidic cell chamber defined by two transparent cover slips. One of these cover slips contains the 700 nm pitch nanovoid array fabricated by 2D-DNI, coated with a 10 nm thick $Al_2O_3$ oxide layer which is positively charged (surface charge density+ 2.06 $mC/m^2$) when immersed in an ionic solution ($10^{-4}$ mol/L KCl). The other cover slip acts as a transparent region for top-down microscopic characterization. In certain aspects, the fluid may comprise a plurality of microspecies or nanospecies, such as nanoparticles. The term "microspecies" is intended to encompass a variety of different species that have at least one microscale dimension. The term "nanospecies" is intended to encompass a variety of different species that have at least one nanoscale dimension. For example, the microspecies/nanospecies may be a charged biological species, a charged microparticle, or charged nanoparticle. Examples of charged biological species may be selected from the group consisting of: proteins, peptides, nucleic acids, cells, such as cancer cells, bacteria, viruses, lipid vesicles, and any combinations thereof. In other aspects, the nanospecies may include inorganic or polymeric nanoparticles. In certain aspects, all spatial dimensions of the nanospecies/nanoparticle component are less than or equal to about 1 µm (1,000 nm).

The term "micro-sized" or "micrometer-sized" as used herein is generally understood by those of skill in the art to mean that the component has at least one dimension less than about 500 micrometers (i.e., 0.5 millimeters). As used herein, a microspecies/microparticle has at least one spatial dimension that is less than about 100 µm (i.e., 100,000 nm), optionally less than about 50 µm (i.e., 50,000 nm), optionally less than about 10 µm (i.e., 10,000 nm), and in certain aspects less than or equal to about 5 µm (i.e., 5,000 nm). In certain aspects, a microspecies/microparticle has at least one spatial dimension that is less than or equal to about 1,000 µm, optionally less than or equal to about 100 µm, optionally less than or equal to about 50 µm, and in certain embodiments, less than or equal to 10 µm. In certain aspects, all spatial dimensions of the microspecies/microparticle component are less than or equal to about 10 µm (1,000 nm).

The term "nano-sized" or "nanometer-sized" as used herein is generally understood to have at least one dimension less than or equal to about 1 micrometer (i.e., 1,000 nanometers). Thus, the nanospecies/nanoparticle has at least one spatial dimension that is less than about 1 µm, optionally less than or equal to about 750 nm, optionally less than about 500 nm, and in certain aspects, less than about 200 nm. In certain aspects, all spatial dimensions of the nanospecies/nanoparticle component are less than or equal to about 1 µm (1,000 nm).

In certain aspects, the microspecies of the present disclosure have an average size or diameter of less than or equal to about 10 micrometers, for example, bacteria. In certain aspects, the nanospecies of the present disclosure have an average size or diameter of less than or equal to about 1,000 nm. In certain aspects, the average diameter of the nanospecies may be greater than or equal to about 20 nm to less than or equal to about 1,000 nm, optionally greater than or equal to about 30 nm to less than or equal to about 1,000 nm, optionally greater than or equal to about 50 nm to less than or equal to about 1,000 nm, optionally greater than or equal to about 100 nm to less than or equal to about 1,000 nm, optionally greater than or equal to about 100 nm to less than or equal to about 900 nm, optionally greater than or equal to about 100 nm to less than or equal to about 800 nm, optionally greater than or equal to about 100 nm to less than or equal to about 500 nm, greater than or equal to about 100 nm to less than or equal to about 300 nm, and in certain variations, optionally greater than or equal to about 2 nm to less than or equal to about 20 nm. Proteins may have an average size or diameter of greater than or equal to about 2 nm to less than or equal to about 20 nm.

The microspecies or nanospecies may have a round shape (e.g., a sphere or spheroid shape) or may have a variety of other shapes, such as discs, platelets, rods, irregular shapes, and the like.

In certain aspects, the fluid may be a suspension that comprises a plurality of nanospecies in the form of nanoparticles, for example, a suspension of negatively charged polystyrene nanoparticles (surface charge density–1.6 mC/m$^2$) which can flow into the fluidic cell (compartment 62 of device 50). A suspension of nanoparticles (e.g., negatively charged polystyrene nanoparticles (NPs)) is injected into the cell immersed in a solution (e.g., NaCl solution), while the microscope 72 monitors and records the motion of the NPs. At least a portion of the nanospecies is selectively associated with the surface defining the two-dimensional pattern of nanovoids, meaning that only a certain population of the nanospecies is capable of assembling in the nanovoids, for example, only nanospecies having a certain size, providing size selectivity and trapping in the nanovoids.

FIG. 8C shows epifluorescence microscopic images of nanoparticles (e.g., polystyrene nanoparticles) docked in the $Al_2O_3$-coated two-dimensional DNI-DNI framework. The inset in FIG. 8C shows SEM images taken after the sample is dried, where the enlarged view in the lower-right corner shows three nanoparticles confined in three grooves in series within the sinusoidal void nanopattern.

FIG. 8D shows simulation characteristics as a nanoparticle descends in the z-direction into the nanovoid of a patterned surface prepared in accordance with certain aspects of the present disclosure. Such characteristics will be discussed in further detail below.

Thus, in certain variations, the present disclosure contemplates a microfluidic device for selective arrangement of nanospecies. The microfluidic device may include a substrate comprising a surface defining a two-dimensional sinusoidal pattern of nanovoids. The microfluidic device comprises a compartment, for example, a microfluidic compartment, that is capable of containing a fluid comprising a plurality of microspecies or nanospecies. In certain aspects, a microfluidic compartment has a volume of less than or equal to about 100 mL, optionally less than or equal to about 10 mL, optionally less than or equal to about 1 mL, optionally less than or equal to about 500 µL, optionally less than or equal to about 400 µL, optionally less than or equal to about 300 µL, optionally less than or equal to about 200 µL, and in certain variations, optionally less than or equal to about 100 µL. The substrate is disposed within the compartment and the surface contacts the fluid. The compartment includes an inlet and an outlet, where the fluid is introduced to the compartment via the inlet and exits the compartment via the outlet. In certain aspects, the substrate is a polymeric substrate selected from the group consisting of: polyethylene terephthalate (PET), polycarbonate (PC), phenol formaldehyde resins (PF), and perfluoroalkoxy (PFA).

The compartment may include at least one transparent region or wall through which the substrate can be viewed inside the compartment. For example, a detector device may thus be positioned on an opposite side of the transparent region to provide information on the surface of the substrate. Such a detector device may be a microscope, in a non-limiting example. Such a transparent region may also receive external electromagnetic radiation or energy to active the nanospecies on the surface of the substrate in other variations.

In certain aspects, the surface has a first charge and the plurality of nanospecies has a second charge opposite charge to the first charge, so that the surface attracts the plurality of nanospecies. The patterned surface may comprise a coating having a first charge and the plurality of nanospecies has a second charge opposite charge to the first charge, so that the surface attracts the plurality of nanospecies. In certain other aspects, the coating comprises aluminum oxide ($Al_2O_3$) having a positive charge and the plurality of nanoparticles comprise polystyrene having a negative charge.

The two-dimensional pattern of nanovoids, for example, a sinusoidal pattern of nanovoids, provides size-selective trapping and assembly of nanospecies therein. In certain variations, the two-dimensional sinusoidal pattern of nanovoids may have a period of greater than or equal to about 10 nm to less than or equal to about 1,000 nm.

In certain aspects, the nanospecies may be nanoparticles, where their unique properties, such as the strong interaction with light, well-defined surface properties, high catalytic activity and in sufficiently small particles, their quantum confinement properties can be exploited. In particular, if particles of a certain size are placed in the array format, many other applications can be exploited including photonic crystals, nanoelectronic devices, optical switches and filters, filtration devices and biological assays. A prerequisite for these applications using particles arrays as functional entities is the control and position selectivity of their arrangement on a surface. Doing so with standard microfabrication techniques is difficult, and it is often time-consuming and inefficient to create sparse patterns of small nanoparticles using subtractive top-down processing. In certain aspects, the present disclosure provides suitable particle patterning and assembly methods with low cost and low complexity. Besides size-selective particle confinement, separation and sorting are highly desired in various applications such as diagnostics, chemical and biological analyses, food and chemical processing and environmental assessment. A number of methods have been reported for size-selective particle confinement, separation and sorting, including pinched flow fractionation (PFF), lateral displacement sorting, hydrodynamic chromatography, electrophoretic deposition (EPD), dielectrophoresis (DEP) and other active means utilizing magnetic, optical and acoustic manipulation techniques. But most of these methods require a continuous driving flow, complicated streamline and microfluidic channel design and usually only work for particles with sizes in micrometer range. For submicron-sized particles, such as nanoparticles, an intrinsic limitation of these conventional methodologies makes them unavailable. Thus separation and sorting submicron-sized particles and biological objects with high throughput has been very challenging.

In comparison, self-assembly from particle-particle interactions enables the possibility of packaging particles over a large scale. However, most self-assembly processes lack size-selectivity and the controllability of the particle arrangements as well as pattern features. However, directed assembly of particles as provided by the certain variations of the present disclosure utilizing particle-substrate interactions allows greater control of the final particle positions as well as the selectivity. In contrast to conventional self-assembly, the geometry-induced electrostatic interaction between charged particles and a nanostructured substrate in ionic solution enables the directed assembly of particles, which does not merely fill predefined structures with randomly dispersed nanoparticles in solution, yet arranges nanoparticles at positions that are defined by the substrate's nanostructured geometry and surface charge.

Thus, for a nanovoid patterned substrate fabricated by 2D dynamic nano-inscribing (DNI) patterning technique, a low-cost and highly scalable method of trapping and sorting nanoparticles in a size-selective manner governed by the geometric-induced electrostatic and entropic interaction between nanoparticles and the nanovoid surface patterns is provided.

FIGS. 9A-9E show creating a nanostructured 2D void pattern with a sinusoidal profile on a polymer substrate using the Dynamic Nano-Inscribing (DNI) technique (as seen in FIG. 9A). To perform DNI, a well-cleaved, $SiO_2$ nanograting mold edge containing the desired pattern is used to inscribe a polycarbonate (PC) substrate with well-controlled contact, heating, and inscribing speed. This process is subsequently repeated in the orthogonal direction, and the deformation of the polymer surface produces the 2D sinusoidal nanovoid pattern as shown in FIG. 9A. A $SiO_2$ grating mold with 700 nm-period is used, which produces the nanovoid pattern with 700 nm in period and 800 nm for the void depth. FIG. 9B shows an SEM image of a side view of the patterned surface of the nanograting mold with the 700 nm period grating This patterning technique enables continuous, scalable and high speed production of 2D nanopatterns on flexible substrates.

FIG. 9C shows a continuously-created 1D grating formed after the nanograting mold contacts and slides over a polymeric substrate under conformal contact and localized heating. FIG. 9D shows a 2D nanovoid pattern formed from a nanograting mold (scale bar 1 μm). FIG. 9D shows a well-defined sinusoidal surface profiles. FIG. 9E is a perspective view of an SEM of 2D-DNI-fabricated nanovoid arrays.

Commercially available flexible substrate films like phenol formaldehyde resins (PF), polycarbonate (PC) and polyethylene terephthalate (PET) are pre-cleaned before patterning. Details of DNI processes along with mold preparation and cleaving procedure are described in Ahn, S. H. et al., "Dynamic nanoinscribing for continuous and seamless metal and polymer nanogratings," Nano Lett. 9, 4392-4397 (2009) and Ok, J. G. et al, "Continuous fabrication of scalable 2-dimensional (2D) micro- and nanostructures by sequential 1D mechanical patterning processes," Nanoscale 6, 14636-42 (2014), the relevant portions of which are incorporated herein by reference.

All polymer substrates (PET and PC from Tekra Corp.) are used as purchased and cleaned using IPA followed by nitrogen drying before the patterning process. To Perform DNI, a well-cleaved $SiO_2$ nanograting mold containing the desired pattern along the edge is prepared. The mold edge is brought into contact with the substrate at a proper angle and force. The mold edge is then slid over the substrate while maintaining a conformal contact. The polymer surface is plastically deformed by the nano-features on the mold edge, leaving behind a well-defined nanograting pattern. This process is subsequently repeated in the orthogonal direction, which produces the sinusoidal void pattern as shown in FIGS. 9D-9E. In DNI, the pattern period is dictated by that of the grating mold and voids of various sizes and geometry can be inscribed in a continuous manner at high speed (about 1 m/min or greater). For instance, a $SiO_2$ grating mold with 700 nm-period for 2D nanovoid patterning is used in this example (unless otherwise noted in the data). Therefore the void patterns can be precisely inscribed to a certain size, depending on the size of the particle to be selectively trapped. Furthermore, the morphologies of the sinusoidal voids created by 2D-DNI can be specifically tailored by changing the substrate material, applied force, and processing temperature.

The microfluidic device for nanoparticle confinement is prepared as follows. A 2D-DNI-patterned PC substrate is coated with a 10 nm-thick $Al_2O_3$ layer by RF sputtering (Lab 18-2, Kurt J. Lesker) and put in the microfluidic cell chamber held at a separation of 1 mm by PDMS spacers between two transparent cover slips (for example, as described above in FIG. 8B). Fluorescent labelled (FITC-525 nm) polystyrene nanoparticles are purchased from Molecular Probes Ltd. and centrifuged and re-aliquoted into solutions with varying ionic concentrations. This nanoparticle suspension has an initial volume fraction of 0.1% wt., which is injected into the compartment/chamber at a fixed flow rate (10 μL/min). As noted above, the 10 nm thick $Al_2O_3$ oxide layer is positively charged (surface charge density+2.06 $mC/m^2$) when immersed in an ionic solution ($10^{-4}$ mol/L KCl), while the polystyrene nanoparticles are negatively charged (surface charge density–1.6 $mC/m^2$). The ionic solution containing NPs is allowed to equilibrate inside the chamber for 15 minutes before microscopic observation.

Richter CCD combined with an Olympus BX-100 fluorescence microscope is used to image the particles in solution with an exposure time of 30 ms. SEM imaging is performed using a Philips XL30-FEG at the typical operating voltage of 10-25 kV, after sputtering a thin Au film nm) to avoid electron charging.

Under the microscope, the dynamics of the nanoparticles in the microfluidic device system according to certain aspects of the present disclosure can be visualized. The charged NPs undergo Brownian motion in solution and experience an electrostatic attraction when they are in the vicinity of the oppositely charged 2D-DNI patterned surface (i.e., within the Debye screening length). Localization and assembly of fluorescently labelled 500 nm diameter polystyrene particles in the patterned voids can be directly visualized. The particle size and surface charge density appear to control the trapping behavior.

FIGS. 10A-10C show the microscope images of 500 nm PS nanoparticles trapped on the substrates with different surface conditions. In the absence of the nanovoid pattern on the substrate, only a few particles are randomly adsorbed on the surface, even in the case when surface charges are presented by the $Al_2O_3$ layer. In contrast, in the presence of the patterned surface with the oxide layer, much greater amounts of particles are trapped onto the substrate. Moreover, as seen in the zoomed-in image (and verified by SEM image) in FIG. 10C, almost all trapped particles are well confined inside the nanovoids, and have been assembled into the pre-defined pattern on the substrate. The trapping is stable, even without any direct chemical linkage. The confined particles adhere to the surface strongly and cannot be removed by rinsing the channel with DI water. Only by using stronger physical force, e.g. placing the substrate in an ultrasonic bath, can most of the particles be dislodged from the surface.

In order to improve the trapping efficiency and particle pattern quality, the particle concentration effect on the void pattern fill ratio is also studied. As this process is diffusion limited and no external stimuli is applied, increasing the particle concentration increases the fill ratio to a certain degree and further increasing the particle concentration beyond 0.01M did not appreciably increase the fill ratio, as shown in FIG. 10D. The fill ratio is saturated around 50%. This can be possibly explained due to the electrostatic repulsion from the particles already confined on the surface. Thus by increasing the spacing between the nanovoids or increasing the attractive particle-substrate interaction, such as by increasing the nanovoid surface charge density, the fill ratio can be enhanced as well as the pattern quality.

Size-selectivity is also demonstrated on the 2D nanovoid patterned surfaces used in a fluidic device. While the 500 nm size particles trapped in a similarly sized void could be expected, an equally interesting occurrence is whether nanoparticles with other sizes could also be trapped in these voids. Therefore experiments are conducted with a fixed void size testing three different particle sizes (200 nm, 500 nm, 1000 nm) to evaluate the trapping behavior. Under similar conditions and at the same mentioned flow rate, only particles of 500 nm diameter appear to be confined in the voids (FIGS. 11B and 11E). In the case of 200 nm particles, some non-specific adsorption is observed but no appreciable confinement in the voids (FIGS. 11A and 11D). Similar results are obtained when testing 1 μm particles (FIGS. 11C and 11F).

These results indicate the size-selective nature of this method, which facilitates submicron-sized particle separation and sorting based on their size and surface charges. To understand this size-selective behavior, this system is modeled and the interaction between the charged particles and the charged void surface simulated using finite element analysis (FEA) method in COMSOL Multiphysics. The free energies for this system is calculated based on mean field Poisson-Boltzmann (PB) theory and analyzed in detail the electrostatic and entropic contributions as a function of particle position above the patterned structure.

The electrostatic potential contributed by both surface charges and ions can be calculated by the dimensionless PB equation, $$\nabla^2 \psi = \kappa^2 \sin h(\psi) \qquad (1)$$

where $$\psi = \frac{e\varphi}{k_B T}$$

is the dimensionless electrostatic potential, $$\kappa = \sqrt{\frac{2c_0 e^2}{\varepsilon \varepsilon_0 k_B T}}$$

and $\kappa^{-1}$ defines the "Debye length" of the electrical double layers (EDLs).

Fixed surface charge is assumed at both particle surface and the surface of the void structures. The boundary conditions for the potential are defined by the surface charge densities:

$$n \cdot \nabla \psi = -\frac{\sigma}{\varepsilon \varepsilon_0 k_B T} \qquad (2)$$

These equations are numerically solved using COMSOL Multiphysics, and next the free energy of the system is calculated by taking into account both the energetic and entropic contributions as a function of particle position above the patterned structure. The free energy of a charge distribution may be analyzed in terms of its electrostatic potential energy and the configurational entropy of the ions and solvent in the electrolyte. The electrostatic energy of the system is given by:

$$U_{es} = \frac{\varepsilon\varepsilon_0}{2}\int_V (E \cdot E) dV \quad (3)$$

The entropy change of the system is given by:

$$\Delta S = k_B \int_V \left\{ \sum_i c_0[z_i\psi\exp(-z_i\psi) + \exp(-z_i\psi) - 1] \right\} dV \quad (4)$$

The integration volumes in both equations are the whole simulation system comprising the charged particle, ions and the surface of the nanovoids. The system's free energy is then obtained:

$$F = U_{es} - T\Delta S \quad (4)$$

So for the present nanopatterned void systems, the free energy can be expressed as:

$$F = \int_V \left\{ \frac{\varepsilon\varepsilon_0}{2}(E \cdot E) - 2c_0 k_B T(-\psi\sinh\psi + \cosh\psi - 1) \right\} dV \quad (5)$$

FIGS. 12A-12E show the calculated energy change of the system, when particles with different size approach the bottom of the void in z-direction. In FIGS. 12A-12C, the geometry of the particles at the lowest positions in the voids for 200 nm (FIG. 12A), 500 nm (FIG. 12B), and 1 μm (FIG. 12C) particles are shown. FIGS. 12D-12F show calculated energy change of the system, when particles are approaching the bottom of the void in z-direction for 200 nm (FIG. 12D), 500 nm (FIG. 12E) and 1 μm (FIG. 12F) diameter particles respectively.

Though from a purely electrostatic energy standpoint, there exists a counterintuitive energetic barrier preventing the particles reaching the bottom of the voids, which is due to the high E field as well as the stored electrostatic energy between the particle and the substrate surface when they get close that depletes the initial screening ions in the EDLs, the free energy of the system that governs the final net force and potential experienced by the particles shows a clearly attractive interaction between the particles and the voids. The appearance of electrostatic energy barrier can be better understood by considering two parallel charged surfaces. The free energy of the two surfaces follows the same behavior as the particle-void system. The attractive interaction governed by the free energy of the system makes the void behave like a trap and clearly for the 500 nm particle, this trap has the deepest potential well and strongest confinement as compared to that for the 200 nm and 1 μm diameter particles. These results perfectly explain that the size-selectivity observed in the experiment is due to the free energy potential well for particles with sizes that appropriately fits the void.

It is instructive to examine the different roles of electrostatic and entropic contributions to the trapping process. The electrostatic interaction appears to be responsible for attracting the particles toward the void surface, but when the surfaces of the particle and the void get close, the EDLs of the two oppositely charged surfaces overlap, so the surrounding cations and anions are depleted in the EDL overlapping region, which weakens the screening of surface charges and thus increases the stored electrostatic energy between these two surfaces. However as the particle approaches the nanovoid surface, some ions from the overlapped EDL region are displaced to the free space above, thus increasing the entropy of the system and leading to strong confinement force. Thus, in the nanovoid systems according to certain aspects of the present disclosure, the entropic energy contributes much more to the final potential well and dominates the size-selective confinement as is shown in FIGS. 12D-12F. And a better geometric fit of the particle and the void will displace larger amount of ions as the gap between the two surfaces closes in, and therefore causes higher increase in entropy, which leads to deeper free energy well. Similar ion depletion process and the appearance of electrostatic energy barrier as well as free energy wells can also be observed in a simpler system of two oppositely charged parallel surfaces.

To verify this explanation, the depth of the free energy potential well experienced by the particles is calculated when they are at the lowest positions in the voids for particles of different sizes from 100 nm to 1 μm. The areas of overlapping EDLs between the particles and the structures are also calculated. As is shown in FIGS. 13A-13B, the depth of the potential well shows direct correlation with the EDLs overlapping areas and both of these two plots show that the nanovoid structure with the current geometry works best for the 500 nm size particles. These numerical results provide support that the "best fit" particles have the largest overlapping areas with the nanovoid structures, which release most amount of ions and cause the largest entropy change. As a result, much deeper and sharper energy traps form for the particles of a particular size. Because the nanovoid geometry is fixed in the above experiment, only particles of particular size can be confined, leading to the observed size-selective confinement and separation of particles. Based on this explanation, the nanovoid pattern design can be optimized in order to better confine and extract desired particles with particular size and geometry, all in a single step process. In certain aspects, a DNI sinusoidal nanovoid structure may have a hemispherical nanovoid structure, which has a deeper free energy well for the desired particles and significantly higher particle size selectivity. Thus a high resolution selective confinement and separation can be achieved with a well-designed geometry of the void structure depending on the nature of the nanoparticles or other nanospecies to be separated.

In certain aspects, a method for selective arrangement of a nanospecies on a substrate may include passing a fluid comprising a nanospecies over a surface of the substrate comprising a two-dimensional pattern of nanovoids. The fluid may be an ionic suspension. The nanospecies have a first charge and the surface has a second charge opposite to the first charge. At least a portion of the nanospecies in the fluid is trapped and assembled within the two-dimensional pattern of nanovoids.

In certain aspects, the nanospecies is a charged biological species or a charged nanoparticle. The charged biological species is selected from the group consisting of: proteins, peptides, nucleic acids, cells, viruses, bacteria, and combinations thereof. In other aspects, the two-dimensional pattern of nanovoids may be sinusoidal. In certain aspects, each void of the two-dimensional pattern of nanovoids has a shape selected from a pyramidal shape or a hemispherical shape. In certain variations, the method may include introducing a fluid into an inlet of a microfluidic compartment in which the substrate is disposed, such as the devices described above. In this manner, the fluid flows over the surface of the substrate comprising a two-dimensional pattern of nanovoids in the compartment. After at least a portion of the nanospecies in the fluid is trapped and assembled within the two-dimensional pattern of nanovoids, the remaining fluid passes out an exit of the microfluidic compartment. Such a method provides the ability to selectively associate a portion of the nanospecies with the nanovoids, thus providing separations or analytical capability, by way of non-limiting example.

Based on the two-dimensional patterning techniques and directed self-assembly of nanoparticles controlled by the geometric-induced electrostatic and entropic interactions, a single-step, low-cost methodology is provided to selectively confine, pattern and sort nanoparticles based upon their size on a flexible substrate with nanovoid patterns over a large area. This size-selective confinement is believed to be due to the free energy change of the system which arises from EDLs overlapping, ionic redistribution and the associated entropy change. The patterning methodology used here can enable continuous and high speed production of 2D nanopatterns on flexible substrates. Application of this selective nanoparticle confinement method can be extended to scalable localization, sorting and manipulation of charged biological objects, such as proteins, lipid vesicles, cancer cells and bacteria.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A microfluidic device for selective arrangement of at least one of a microspecies and nanospecies, the device comprising:
   a substrate comprising a surface defining a two-dimensional sinusoidal pattern of discontinuous microvoids or nanovoids each comprising at least one curved surface;
   a microfluidic compartment, wherein the substrate is disposed within the compartment and the surface contacts a fluid comprising the at least one of the microspecies and nanospecies contained in the microfluidic compartment;
   an inlet to the microfluidic compartment; and
   an outlet to the microfluidic compartment; wherein the fluid comprising the at least one of the microspecies and nanospecies is introduced to the microfluidic compartment via the inlet and exits the microfluidic compartment via the outlet.

2. The microfluidic device of claim 1, wherein the substrate is a polymeric substrate selected from the group consisting of: polyethylene terephthalate (PET), polycarbonate (PC), phenol formaldehyde resins (PF), and perfluoroalkoxy (PFA).

3. The microfluidic device of claim 1, wherein the microfluidic compartment comprises at least one transparent region through which the surface of the substrate is visible to an external detector.

4. The microfluidic device of claim 1, wherein the two-dimensional pattern of nanovoids is a sinusoidal pattern of nanovoids having a period of greater than or equal to about 50 nm to less than or equal to about 1 μm.

5. The microfluidic device of claim 1, wherein the surface has a first charge and the microspecies and nanospecies has a second charge opposite charge to the first charge, so that the surface attracts the microspecies and nanospecies.

6. The microfluidic device of claim 1, wherein the surface comprises a coating having a first charge and the microspecies and nanospecies has a second charge opposite charge to the first charge, so that the surface attracts the microspecies and nanospecies.

7. The microfluidic device of claim 6, wherein the coating comprises aluminum oxide ($Al_2O_3$) having a positive charge and the at least one of the microspecies and nanospecies has a negative charge.

8. A method of forming the substrate comprising the surface defining the two-dimensional sinusoidal pattern of discontinuous microvoids or nanovoids for the microfluidic device of claim 1, the method comprising:
   periodically contacting a vibrating tool comprising a patterned grating edge with the substrate along a first direction in a grating-vibrational indentation patterning process, wherein the patterned grating edge defines a plurality of rows and a plurality of interspersed troughs and the periodically contacting creates a two dimensional array of discontinuous voids in a single-stroke across the substrate to form the two-dimensional sinusoidal pattern of discontinuous microvoids or nanovoids.

9. The method of claim 8, wherein the vibrating tool is a cleaved hard mold tool comprising silicon dioxide ($SiO_2$).

10. The method of claim 8, wherein the plurality of rows defines a period of greater than or equal to about 50 nm to less than or equal to about 10 μm.

11. The method of claim 8, wherein the substrate is a polymeric substrate selected from the group consisting of: polyethylene terephthalate (PET), polycarbonate (PC), phenol formaldehyde resins (PF), and perfluoroalkoxy (PFA).

12. A method for selective arrangement of at least one of a microspecies and nanospecies on a substrate, the method comprising:
   passing a fluid comprising the at least one of the microspecies and nanospecies over a surface of the substrate comprising a two-dimensional sinusoidal pattern of discontinuous microvoids or nanovoids each comprising at least one curved surface, wherein the at least one of the microspecies and nanospecies has a first charge and the surface has a second charge opposite to the first charge, wherein at least a portion of the at least one of the microspecies and nanospecies in the fluid is trapped and assembled within the two-dimensional sinusoidal pattern of discontinuous microvoids or nanovoids.

13. The method of claim 12, wherein the at least one of the microspecies and nanospecies is a charged biological species or a charged nanoparticle.

14. The method of claim 13, wherein the charged biological species is selected from the group consisting of: proteins, peptides, nucleic acids, cells, viruses, bacteria, and combinations thereof.

15. The method of claim 12, wherein each void of the two-dimensional sinusoidal pattern of discontinuous microvoids or nanovoids has a hemispherical shape.

16. The method of claim 12, wherein the fluid is introduced into an inlet of a microfluidic compartment in which the substrate is disposed, so that the fluid flows over the surface of the polymeric substrate comprising the two-dimensional sinusoidal pattern of discontinuous microvoids or nanovoids in the compartment, wherein after at least a portion of the at least one of the microspecies and nanospecies in the fluid is trapped and assembled within the two-dimensional sinusoidal pattern of discontinuous microvoids or nanovoids, the remaining fluid passes out an exit of the microfluidic compartment.

17. A microfluidic device for selective arrangement of a nanospecies, the device comprising:
- a substrate comprising a surface defining a two-dimensional pattern of nanovoids comprising at least one curved surface and having a maximum dimension of less than or equal to about 1 μm;
- a microfluidic compartment, wherein the substrate is disposed within the compartment and the surface contacts a fluid comprising the nanospecies contained in the microfluidic compartment;
- an inlet to the microfluidic compartment; and
- an outlet to the microfluidic compartment; wherein the fluid comprising the nanospecies is introduced to the microfluidic compartment via the inlet and exits the microfluidic compartment via the outlet.

18. The microfluidic device of claim 17, wherein the two-dimensional pattern of nanovoids is a sinusoidal pattern of nanovoids having a period of greater than or equal to about 50 nm to less than or equal to about 1 μm, wherein each of the nanovoids has a hemispherical shape.

19. The microfluidic device of claim 17, wherein the surface comprises a coating comprising aluminum oxide ($Al_2O_3$) having a positive charge and the at least one of the microspecies and nanospecies has a negative charge.

* * * * *